United States Patent
Klipstein

(10) Patent No.: US 7,928,473 B2
(45) Date of Patent: Apr. 19, 2011

(54) DEPLETION-LESS PHOTODIODE WITH SUPPRESSED DARK CURRENT AND METHOD FOR PRODUCING THE SAME

(75) Inventor: Philip Klipstein, Zikhron Ya'acov (IL)

(73) Assignee: An Elbit Systems-Rafael Partnership, Haifa (IL)

( * ) Notice: Subject to any disclaimer, the term of this patent is extended or adjusted under 35 U.S.C. 154(b) by 0 days.

(21) Appl. No.: 12/850,116

(22) Filed: Aug. 4, 2010

(65) Prior Publication Data
US 2010/0295095 A1    Nov. 25, 2010

Related U.S. Application Data

(63) Continuation of application No. 10/561,729, filed as application No. PCT/IL2004/000573 on Jun. 28, 2004, now Pat. No. 7,795,640.

(30) Foreign Application Priority Data
Jul. 2, 2003  (IL) .......................... 156744

(51) Int. Cl.
*H01L 21/00*  (2006.01)

(52) U.S. Cl. . 257/188; 257/185; 257/186; 257/E31.033; 257/E31.067; 438/93; 438/94

(58) Field of Classification Search .......... 257/185, 257/186, 188, E31.033, E31.067; 438/93, 438/94

See application file for complete search history.

(56) References Cited

U.S. PATENT DOCUMENTS

| | | | |
|---|---|---|---|
| 4,679,063 A | 7/1987 | White | |
| 4,729,004 A | 3/1988 | Sakai et al. | |
| 4,740,819 A | 4/1988 | Kawata et al. | |
| 5,016,073 A | 5/1991 | Elliott et al. | |
| 6,117,702 A | 9/2000 | Kyozuka et al. | |
| 6,635,907 B1 * | 10/2003 | Nguyen et al. | 257/183 |
| 6,803,557 B1 | 10/2004 | Taylor et al. | |
| 7,161,170 B1 * | 1/2007 | Yoder | 257/21 |
| 7,687,871 B2 | 3/2010 | Maimon | |
| 2002/0027238 A1 | 3/2002 | Lin et al. | |

(Continued)

FOREIGN PATENT DOCUMENTS

WO    WO 02 084740    10/2002

(Continued)

OTHER PUBLICATIONS

S.Maimon et al., "InAsSb/GaAISb/InAsSb nBn IR detector for the 3-5 um" The 11th International Conference on Narrow Gap Semiconductors (Programs & Abstracts) University of Buffalo, Jun. 16-20, 2003 pp. 1-2.

(Continued)

*Primary Examiner* — Wael M Fahmy
*Assistant Examiner* — John C Ingham
(74) *Attorney, Agent, or Firm* — Frommer Lawrence & Haug LLP; William S. Frommer

(57) ABSTRACT

The invention relates to a photo-detector with a reduced G-R noise, which comprises a sequence of a p-type contact layer, a middle barrier layer and an n-type photon absorbing layer, wherein the middle barrier layer has an energy bandgap significantly greater than that of the photon absorbing layer, and there is no layer with a narrower energy bandgap than that in the photon-absorbing layer.

42 Claims, 16 Drawing Sheets

U.S. PATENT DOCUMENTS

2007/0034898 A1    2/2007    Tennant et al.

FOREIGN PATENT DOCUMENTS

| WO | WO 2005 004243 | 1/2005 |
|---|---|---|
| WO | WO 2007089222 | 8/2007 |

OTHER PUBLICATIONS

J.L. Johnson et al., "Electrical and optical properties of infrared photodiodes using the $InAs/Ga_1-xIn_xSb$ superlattice in heterojunctions with GaSb", Journal of Applied Physics, vol. 80, pp. 1116-1127, Jul. 15, 1996.

C.T. Elliott, "Advanced Heterostructures for $In_1-xAl_xSb$ and $Hg_1-xCd_xTe$ detectors and emitters", SPIE proceedings vol. 2744, pp. 452-462, Jun. 1996.

A. Rakovska et al., "Room temperature InAsSb photovoltaic midinfrared detector", Applied Physics Letters, vol. 77, p. 397 (2000), May 2000.

S. Maimon et al: "nBn detector, an infrared detector with reduced dark current and higher operating temperature", Applied Physics Letters, AIP, Amer. Inst. of Physics, Melville, NY, vol. 89, No. 15, Oct. 10, 2006, XP012086238.

Shyh Wang, chapter 8 of his book entitled "Fundamentals of Semiconductor Theory and Device Physics" (published by Prentice Hall, ISBN 0-13-344425-2), Jun. 1989.

J Bajaj, "State-of-the-art HgCdTe Infrared Devices" SPIE proceedings No. 3948, pp. 42-54, San Jose, Jan. 2000 (Fig. 3).

P C Klipstein et al., "Antimonide Based Materials for Infrared Detection" SPIE proceedings No. 4820, pp. 653-662, Seattle, Jul. 2002.

P C Klipstein et al, "Semiconductor Heteroepitaxy", published by World Scientific, Singapore, pp. 515-523, ISBN 981 02 2479 6, Jul. 1995.

T Ashley et al., in "Large Format MWIR Focal Plane Arrays", in SPIE proceedings vol. 4820, pp. 400-405, Jan. 2003.

"Growth and Characterization of Semiconductors", edited by R A Stradling and P C Klipstein, published by Adam Hilger (1990), ISBN 0-85274-131-6, Jan. 1990.

I. Vurgaftman et al.: Band Parameters for III-V compound semiconductors and their alloys, Applied Physics Review, vol. 89, No. 11, p. 5815 and pp. 5854-5875, Jun. 1, 2001.

Park J. et al., "Reduction of dark . . . structure", Solid State Electronics, Elsevier Science Publishers, vol. 46, No. 5, May 2002, pp. 651-654, XP004346693.

Watanabe I et al., "Extremely low dark . . . APD", Proceedings of the Int'l Conf. on Indium Phosphide and Related Materials, vol. Conf. 4, Apr 21, 1992, pp. 246-249, XP010058406.

P.C. Klipstein, "XBn" Barrier Photodetectors for High Sensitivity and High Operating Temperature Infrared Sensors; Proc. Infrared Technology and Applications XXXIV, SPIE 6940, 6940-2U (2008).

* cited by examiner

US 7,928,473 B2

DEPLETION-LESS PHOTODIODE WITH SUPPRESSED DARK CURRENT AND METHOD FOR PRODUCING THE SAME

This is a continuation of U.S. application Ser. No. 10/561,729, filed on Feb. 12, 2007 now U.S. Pat. No. 7,795,640, under 35 USC 371, based on International Application PCT/IL2004/000573 filed on Jun. 28, 2004 with a claim of priority benefit to Israel Application No. 156744 filed in Israel on Jul. 2, 2003, respectively, the entirety of which are hereby incorporated herein by reference.

FIELD OF THE INVENTION

The present invention relates to photodiodes for sensing light radiation. More particularly, the present invention relates to a photodiode structure, in which the level of the dark current is significantly reduced, therefore improving the signal-to noise ratio. Furthermore, the invention relates to a method for producing such photodiode.

BACKGROUND OF THE INVENTION

Photodiodes are widely used for sensing light radiation. There are many applications in which the level of the light which is required to be sensed is very low, and therefore the sensitivity of said photodiodes is a critical requirement.

It is well known in the art that the signal-to-noise ratio which can be obtained from photodiodes (and from many other electronic components) is limited by the level of the "thermal noise", which in turn is related to the temperature of the component. The term "dark current" is commonly used in the art to define the current flowing in a photodiode during a total dark condition. The signal-to-noise ratio in photodiodes is conventionally improved by cooling the component, in many cases down to very low temperatures close to 0° K. The means for cooling and maintaining such a low temperature in photodiodes, however, are cumbersome and expensive, and in any case can reduce the noise down to a limited value.

The dark current is generally composed of two main components. The first component, hereinafter referred to as "the diffusion dark current" is due to the thermal excitation of carriers across the complete energy bandgap of the photodiode material. As said, the level of this current can be reduced by means of cooling the component. The second component affecting the level of the dark current is known as the "Generation-Recombination" current (hereinafter "G-R dark current"). The level of the G-R dark current can also be reduced by cooling, but at a slower rate of reduction with temperature.

At low temperatures, where the level of the diffusion dark current is reduced sufficiently, the G-R dark current generally becomes the most dominant component of the dark current. There have been made many efforts in trying to reduce the level of the thermal noise. However, there are not known many of such efforts for reducing the G-R current.

FIG. 1 is a band diagram showing the principle of operation of a photodiode according to the prior art. In a semiconductor p-n junction 1-2, a depletion region 3 is formed around the metallurgical junction due to the transfer of electrons from donors in the n-side 2 of the depletion region to acceptors in the p-side 1. The conduction band ($E_C$) and valence band ($E_V$) are bent in the depletion region. This bending is associated with an electric field that drives electrons 7 towards the n-side and holes 8 towards the p-side of the junction. When a bias is applied to the junction, quasi Fermi levels can be defined in each of the two "flat-band" regions. The quasi Fermi level lies near the valence band on the p-side ($E_F(p)$) and near the conduction band on the n-side ($E_F(n)$). At zero bias, the energies of the two quasi Fermi levels are equal. The energy separation of the two quasi Fermi levels in electron-volts is equal to the applied bias in volts. If a reverse bias $V_{rev}$ is applied to the diode, the following relationship holds:

$$V_{rev} = E_F(p) - E_F(n).$$

The energy gap is given by $E_G = E_C - E_V$. Although $E_C$ and $E_V$ change with position due to the band bending in the depletion region, their energy separation is constant everywhere for a "homo-junction" diode ("homo-junction" means that the same material is used on each side of the p-n junction).

Light 9 can be absorbed by promoting an electron 119 from the valence band to the conduction band. The missing electron in the valence band is called a hole, and is indicated by numeral 118. The longest wavelength for this process is called the cut off wavelength and is given by: $\lambda_C = hc/E_G$, wherein h is Planck's constant and c is the velocity of light.

The "photo-created" hole 118 in process 9 exists in the n-type material 2 and so is a minority carrier. It can diffuse, as indicated by numeral 10 to the depletion region where it is accelerated 8 into the p-side 1 by the electric field in the depletion region 3. An analogous process can occur in the p-type material 1 where a minority electron is created by the absorption of light. It can diffuse to the depletion region where it is accelerated 7 into the n-side 2 by the electric field in the depletion region 3.

Generation-Recombination (G-R) centers 4, also known as Shockley-Read traps or Shockley-Hall-Read traps, are energy levels that lie close to the middle of the band gap. They are related to imperfections or impurities inside the crystal. The probability of process 9 to occur due to heat (in the absence of an external photon flux) is essentially proportional to $\exp(-E_G/kT)$ where k is Boltzman's constant and T is the absolute temperature. This process (and the equivalent process on the p-side) gives rise to the "dark current" in a perfect diode with no G-R centers. In this case the dark current is all due to diffusion dark current, and the device is said to be at "the diffusion limit".

In an asymmetric $p^+$-n homo-junction, where the p-doping is several orders of magnitude greater than the n-doping, it can easily be shown that, in the diffusion limit, the higher of the two minority carrier concentrations, in said $p^+$-n case the minority holes on the n-side, makes the dominant contribution to the dark current.

Since free electrons 7 and holes 8 are removed efficiently by the electric field in the depletion region 3, especially when a reverse bias is applied, an electron that undergoes excitation 5 from the valence band $E_V$ to the G-R center 4 cannot return to the valence band. It can only be further excited 6 to the conduction band. Processes 5, 6, 7, and 8 thus give rise to the G-R dark current.

The rate of electron generation by traps, in unit volume of the reverse biased depletion region 3 due to a process, 5, 6, 7, and 8, is approximately described by the formula $$G = \frac{n_i^2}{\tau_{n0} p' + \tau_{p0} n'} \tag{1}$$

where $n_i$ is the so called intrinsic carrier concentration (the carrier concentration in the perfectly pure material) and $\tau_{n0}$, $\tau_{p0}$ are the electron and hole minority carrier lifetimes. This formula may be found, for example, as equation (8.9.2) in chapter 8 of the book by Shyh Wang, entitled "Fundamentals of Semiconductor Theory and Device Physics" (published by Prentice Hall, ISBN 0-13-344425-2). Here $n'=n \cdot e^{(E_t-E_F)/kT}$ and $p'=p \cdot e^{(E_F-E_t)/kT}$ where n, p, and $E_F$ are the electron concentration, the hole concentration and the Fermi level respectively in a given sample of the semiconductor material, $E_t$ is the energy of the trap, and T is the absolute temperature. It can be demonstrated that G in equation (1) is largest when the trap lies near the middle of the energy bandgap. In this case it is easy to show using the above formulae, that $$G \approx \frac{n_i}{(\tau_{n0} + \tau_{p0})} \quad (2)$$

Hence it follows that G is proportional to the intrinsic carrier concentration, the formula for which contains an exponential factor: $\exp(-E_G/2\,kT)$. The dark current due to generation-recombination centers is itself proportional to G and so will also vary essentially as: $\exp(-E_G/2\,kT)$. It is the weaker temperature dependence of the G-R contribution to the dark current ($\exp(-E_G/2\,kT)$) compared with the diffusion contribution ($\exp(-E_G/kT)$) that causes the G-R contribution to dominate at low temperatures. The ratio of the G-R dark current to the diffusion dark current in a $p^+$-n diode is given by equation (8.9.6) in chapter 8 of the earlier mentioned book by Shyh Wang, as:

$$\frac{J_{G-R}}{J_{diff}} = \frac{L_{dep}}{L_p} \times \frac{N_D}{n'} \quad (3)$$

where $L_{dep}$ is the thickness of the depletion region, and $N_D$ and $L_p$ are the doping and minority carrier diffusion length on the n-side of the junction. Typical values of $L_{dep}$ and $L_p$ are ~0.5μ and 20μ, respectively.

Typical narrow gap homo-junction photo-diodes based on e.g. InSb, InAsSb, HgCdTe, etc., are in many cases operated at reduced temperatures, in order to limit the dark current. For such devices operated at 77K, G-R centers typically increase the dark current above the diffusion limit by at least 3-4 orders of magnitude in the MWIR (3-5μ) and 1-2 orders of magnitude in the LWIR (8-12μ) cut-off wavelength regions, behaviour that in each case is consistent with equation (3). This effect may easily be seen in J Bajaj, SPIE proceedings no. 3948 page 45 (FIG. 3 of this article), San Jose, January 2000, or in P C Klipstein et al., SPIE proceedings number 4820, page 653 (FIG. 2 of this article), Seattle, July 2002.

The prior art has failed to specifically address the issue of suppressing the G-R contribution to the current by a suitable hetero-junction design.

A design published by J L Johnson et al., Journal of Applied Physics, volume 80, pages 1116-1127 (FIG. 3) shows a diode made between an n-type narrow bandgap semiconductor with a relatively low doping level and formed from a type II InAs/Ga$_{1-x}$In$_x$Sb superlattice, and a p-type wide bandgap semiconductor with a relatively high doping level, formed from GaSb. This asymmetric doping ensures that most of the depletion region, with its associated electric field, exists in the narrow bandgap photon absorbing layer made from the type II superlattice. There is no discussion in the article about the importance of removing the electric field from this narrow bandgap region. It appears that the main reason for using a heterojunction p-contact instead of a homo-junction p-contact in this article is one of convenience, since the p-type heterojunction contact is easier to grow than a p-type type II superlattice.

FIG. 2 of the article by C T Elliott "Advanced Heterostructures for In$_{1-x}$Al$_x$Sb and Hg$_{1-x}$Cd$_x$Te detectors and emitters", SPIE proceedings vol. 2744, page 452, discloses photodiode devices in which the dark current is reduced by means of the suppression of Auger-related generation processes. Hereinafter, these devices will be referred to shortly as "Elliott devices". In contrast to the present invention, whose essential part, as will be shown hereinafter, has a wide bandgap semiconductor sandwiched between n-type and p-type semiconductors with similar or narrower bandgaps, the essential part of said Elliott devices has a narrow bandgap semiconductor, clad on each side by an n-type and a p-type semiconductor respectively, each with a larger effective bandgap.

As will be further shown hereinafter, the Elliott devices are based on a different principle than that of the present invention. They are aimed for operating essentially at higher temperatures than for the devices of the present invention, typically room temperature or slightly cooler, in which thermal generation across the bandgap is significant. Under this condition, Auger processes are known to limit drastically the carrier lifetime. By applying a sufficiently large reverse bias to an Elliott device, the free carrier concentration may be reduced to a level characteristic of a lower temperature, so that the Auger processes are suppressed, and the reverse bias dark current or "saturation current" is reduced.

In the article "Advanced Heterostructures for In$_{1-x}$Al$_x$Sb and Hg$_{1-x}$Cd$_x$Te detectors and emitters" by C T Elliott, SPIE proceedings vol. 2744, pages 452-462, it is stated (page 453): "Minority carrier exclusion and extraction occur at the pit and πn junctions respectively and the densities of both carrier types in the active π region decrease . . . as a consequence the thermal generation rates involving Auger processes fall, so that the saturation leakage current is less than would be expected from the zero bias resistance and a region of negative conductance is predicted to occur". The article then goes on to point out that, in contrast to the object of the present invention, G-R currents are not suppressed. It states: "In InSb devices with a π active region, however, the density and energy of Shockley-Read traps is such that an increase in thermal generation through traps occurs as the diodes are reverse biased, so that negative conductance is only observed above room temperature". From this statement it may be learned that even at room temperature, an Elliott device based on InSb, exhibits large G-R currents in reverse bias. This is to be expected because there is a significant depletion layer, with an associated electric field, in the low doped π-region of the device, which is also the region with the narrowest bandgap.

There are several other embodiments of the Elliott device based on other materials. For example in the article by A. Rakovska, V. Berger, X. Marcadet, B. Vinter, G. Glastre, in Applied Physics Letters, volume 77, page 397 (2000), a device is described with a photon absorbing layer of InAs$_{0.91}$Sb$_{0.09}$. In this case, diffusion limited behaviour was observed down to 200K, as expected at high operating temperatures. At lower temperatures, where the G-R dark current might be expected to dominate, leakage currents dominated instead due to the lack of a suitable surface passivation treatment. The authors speculate in their conclusion that by increasing the bandgap of one of the cladding layers they might be able to further reduce the diffusion dark current above 200K to the point where the G-R dark current is dominant. The clear implication is that since the diffusion dark current reduces faster with temperature, the G-R dark current is expected to dominate below 200K and no special steps are taken to avoid this.

It is an object of the present invention to provide a photodiode in which the dark current is significantly reduced, particularly at low temperatures, generally in the range of about 77 to 200° K, depending on the material and wavelength of operation.

It is a particular object of the present invention to provide a photodiode in which the level of the G-R current is significantly suppressed in a given temperature.

It is still an object of the present invention to reduce the need for cooling, by providing a photodiode structure having a level of dark current that would alternatively exist in a much lower temperature.

It is still a further object of the invention to provide a method and process for manufacturing the photodiode of the present invention.

Other objects and advantages of the present invention will become apparent as the description proceeds.

SUMMARY OF THE INVENTION

In a first alternative, the present invention relates to a photo-detector with a reduced G-R noise, comprising a sequence of a p-type contact layer, a middle barrier layer and an n-type photon absorbing layer, said middle barrier layer having an energy bandgap significantly greater than that of the photon absorbing layer, and there being no layer with a narrower energy bandgap than that in the photon-absorbing layer.

Preferably, the following band alignments exist when all the bands are flat: the valence band edge of the barrier layer lies below the conduction band edge of the photon absorbing layer, the valence band edge of the contact layer lies below its own conduction band edge or the conduction band edge of the barrier layer by more than the bandgap energy of the photon absorbing layer;

Preferably, the middle barrier layer is a p-type material.

Preferably, the middle barrier layer is an n-type material.

Preferably, when the photo-detector is biased with an externally applied voltage, the bands in the photon absorbing layer next to the barrier layer are flat or accumulated, and when flat, the valence band edge of the photon absorbing layer lies below that of the barrier layer which in turn lies below that of the contact layer.

Preferably, when the photo-detector is biased with an externally applied voltage, the bands in the photon absorbing layer next to the barrier layer are flat or accumulated, and the valence band edge of the flat part of the photon absorbing layer lies below the valence band edge of the contact layer and an energy of not more than $10\,kT_{op}$ above the valence band edge in any part of the barrier layer, where k is the Boltzman constant and $T_{op}$ is the operating temperature.

Preferably, the photon absorbing layer has a typical thickness of 1-10μ and doping of $n<10^{16}\,cm^{-3}$.

Preferably, the photon absorbing layer is an $InAs_{1-x}Sb_x$ alloy.

Preferably, the photon absorbing layer is a type II superlattice material which comprises alternating sub-layers of $InAs_{1-w}Sb_w$ and $Ga_{1-x-y}In_xAl_ySb_{1-z}As_z$ with $0\leq w\leq 1$, $0\leq x\leq 1$, $0\leq y\leq 1$, $0\leq z\leq 1$ and $x+y<1$ and wherein the sub-layers each have a thickness in the range of 0.6-10 nm.

Preferably, the photon absorbing layer is InSb or an $In_{1-x}Al_xSb$ alloy.

Preferably, the contact layer is p-type GaSb.

Preferably, the contact layer is a p-type, type II superlattice comprising alternating sub-layers of $InAs_{1-w}Sb_w$ and $Ga_{1-x-y}In_xAl_ySb_{1-z}As_z$ with $0\leq w\leq 1$, $0\leq x\leq 1$, $0\leq y\leq 1$, $0\leq z\leq 1$ and $x+y<1$ and wherein the sub-layers have a thickness in the range of 0.6-10 nm.

Preferably, the contact layer is InSb or an $In_{1-x}Al_xSb$ alloy.

Preferably, the middle barrier layer is a $Ga_{1-x}Al_xSb_{1-y}As_y$ alloy with $0\leq x\leq 1$ and $0\leq y\leq 1$.

Preferably, the middle barrier layer is an $In_{1-x}Al_xSb$ alloy.

Preferably, the middle barrier layer has a thickness of between 0.05 and 1 μm.

Preferably, the barrier layer is low-doped p-type, typically $p<10_{15}\,cm^{-3}$, and a p-n junction is formed between said barrier layer (12) and the n-type photon absorbing layer.

Preferably, the barrier layer is doped p-type, $p<5\times10^{16}\,cm^{-3}$ and a p-n junction is formed between said barrier layer and an n-type δ-doping layer formed at the edge of the photon absorbing layer.

Preferably, the barrier layer is doped n-type, $n<5\times10^{16}\,cm^{-3}$, and a p-n junction is formed between said barrier layer and a p-type, $p<5\times10^{18}\,cm^{-3}$, contact layer.

Preferably, an n-type δ-doping layer, typically with $5\times10^{10}<n<10^{12}$ donors $cm^{-2}$, is included at the edge of the photon absorbing layer.

Preferably, the n-type photon absorbing layer is terminated by a highly n-doped, $n<3\times10^{18}\,cm^{-3}$, terminating layer of thickness 0.5-4μ, so that the valence band edge of said highly n-doped terminating layer lies below that of the n-type photon absorbing layer.

Preferably, the photo-detector of the invention is grown on substrate selected from GaSb, InSb, InAs, GaAs, Ge, Si, InP or other substrate related material.

Preferably, the photo-detector of the invention is grown on a compliant substrate.

Preferably, the photo-detector of the invention is grown by Liquid Phase Epitaxy (LPE).

Preferably, the photo-detector of the invention is grown is grown by vapour phase epitaxy, such as Molecular Beam Epitaxy (MBE) or Metal-Organic Vapour Phase Epitaxy (MOVPE) or one of their derivatives.

In another alternative, the invention relates to a photo-detector with a reduced G-R noise, which comprises a sequence of a n-type contact layer, a middle barrier layer and an p-type photon absorbing layer, said middle barrier layer having an energy bandgap greater than that of the photon absorbing layer, and there being no layer with a narrower energy bandgap than that in the photon-absorbing layer.

Preferably, the following band alignments exist when all the bands are flat: the conduction band edge of the barrier layer lies above the valence band edge of the photon absorbing layer, the conduction band edge of the contact layer lies above its own valence band edge or the valence band edge of the barrier layer by more than the bandgap energy of the photon absorbing layer. Preferably, the middle barrier layer is a p-type material.

Preferably, the middle barrier layer is an n-type material.

Preferably, when the photo-detector is biased with an externally applied voltage, the bands in the photon absorbing layer next to the barrier layer are flat or accumulated, and when flat, the conduction band edge of the photon absorbing layer lies above that of the barrier layer which in turn lies above that of the contact layer.

Preferably, when the photo-detector is biased with an externally applied voltage, the bands in the photon absorbing layer next to the barrier layer are flat or accumulated, and the conduction band edge of the flat part of the photon absorbing layer lies above the conduction band edge of the contact layer, and an energy of not more than $10\,kT_{op}$ below the conduction band edge in any part of the barrier layer, where k is the Boltzman constant and $T_{op}$ is the operating temperature.

Preferably, the photo-detector the photon absorbing layer has a typical thickness of 1-10μ and doping of $p<10^{16}\,cm^{-3}$.

Preferably, the barrier layer is a low-doped n-type material and a p-n junction is formed between said barrier layer and the p-type photon absorbing layer.

Preferably, the barrier layer is doped n-type, $n < 5 \times 10^{16}$ $cm^{-3}$ and a p-n junction is formed between said barrier layer and a p-type δ-doping layer formed at the edge of the photon absorbing layer.

Preferably, the barrier layer is doped p-type, $p < 5 \times 10^{16}$ $cm^{-3}$, and a p-n junction is formed between said barrier layer and a n-type, $n < 5 \times 10^{18}$ $cm^{-3}$, contact layer.

Preferably, a p-type δ-doping layer is included at the edge of the photon absorbing layer.

Preferably, the p-type photon absorbing layer is terminated by a highly p-doped, $p < 3 \times 10^{18}$ $cm^{-3}$, terminating layer of thickness 0.5-4μ, so that the conduction band edge of the highly p-doped terminating layer lies above that of the p-type photon absorbing layer.

In still another aspect, the present invention relates to a photo-detector sensitive to more than one wavelength band, which comprises stacked detector units as described in one of the alternatives above, or a combination thereof, in which each detector unit has a different cut-off wavelength.

In still another aspect, the present invention relates to an array of identical detectors according to one of the alternatives above, in which each detector is connected to a silicon readout circuit by indium bumps.

In still another aspect, the present invention relates to an array of identical detectors in which each detector is sensitive to more than one wavelength band, in which each detector is connected to a silicon readout circuit using one indium bump or using one indium bump per wavelength band.

DETAILED DESCRIPTION OF PREFERRED EMBODIMENTS

Figure 1:
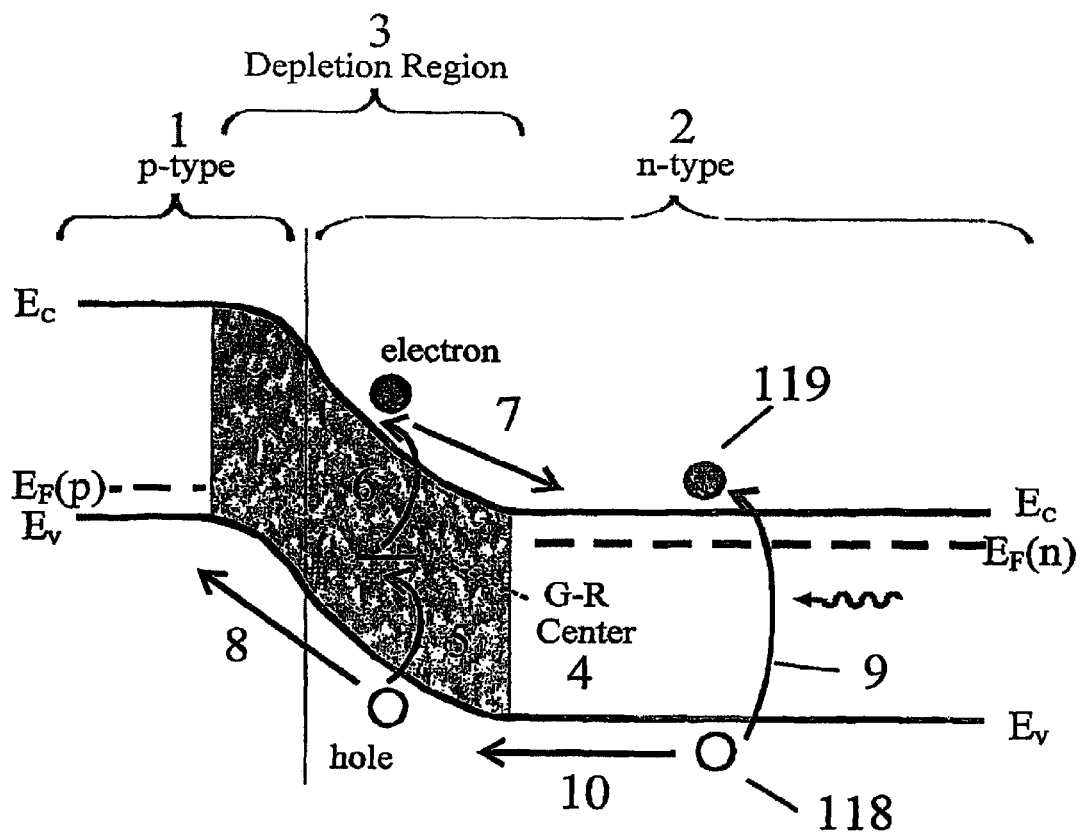
FIG. 1 shows an exemplary energy band diagram of a standard p-n homo-junction photo-detector, and demonstrates the mechanisms of thermal generation of carriers due to G-R centers and optical generation of carriers by means of absorption of a photon.

As said, the present invention provides a structure for a photodiode in which the dark level of the G-R current, and therefore the level of the total dark current is significantly reduced. This is of most importance in photodiodes that are cooled to low temperatures, typically in the range of 77° K to 200° K, in which the G-R current can provide the most dominant contribution to the dark current.

Referring now to FIGS. 2a-2d and FIGS. 4a, 5a, 6a, 7a and 8a, the present invention is characterized by the following features (for the sake of simplicity, these features will be referred herein as "the characterizing features"):

1. A 3-layer, or two hetero-junction, light detector (a hetero-junction is a junction between different materials), of the form of p-p-n or p-n-n is used, wherein the last n-layer 13, 13A, 23 or 33 has a narrow gap chosen for its cut-off wavelength and the middle-layer 12, 12A, 16, 16A, 26 or 34 has a wider band-gap.

The last n-type layer 13, 13A, 23 or 33 absorbs the light impinged on the detector. Hereinafter, the last, n-type layer 13, 13A, 23 or 33 (depending on the specific embodiment used), is also referred to as "the active photon absorbing layer".

The middle layer 12, 12A, 16, 16A, 26 or 34 (again, depending on the specific embodiment used) prevents inter-band tunneling of electrons from the valence band of the p-type layer 11, 21, 35 or 39 to the conduction band of the photon-absorbing layer. Hereinafter, the said middle layer 12, 12A, 16, 16A, 26 or 34, is also referred to as "the barrier layer".

The first layer 11, 21, 35 or 39 (depending on the specific embodiment used) acts as a contact for biasing the device. Hereinafter, the first layer 11, 21, 35 or 39 is also referred to as "the contact layer".

2. The materials forming the photo-detector of the invention are chosen such that in a flat band condition either the photon-absorbing layer 13, 13A, 23 or 33 or the barrier layer 12, 12A, 16, 16A, 26 or 34 has the lowest valence band energy, and the valence band of the photon absorbing layer is never more than about $10\,kT_{op}$ above the valence band of the barrier layer, where $T_{op}$ is the absolute operating temperature. Also in the same condition, the valence band energy of the contact-layer 11, 21, 35 or 39 is equal to or higher than that of the photon absorbing layer 13, 13A, 23 or 33 and above that of the barrier layer 12, 12A, 16, 16A, 26 or 34 which is below the conduction band of the photon-absorbing layer 13, 13A, 23 or 33. These conditions can be expressed mathematically as $E_G^\alpha - \Delta \geq 0$ and $\xi \geq 0$ if $\Delta$ is positive or $\xi + \Delta \geq 0$ and $\Delta + 10\,kT_{op} \geq 0$ if $\Delta$ is negative. $E_G^\alpha$ indicates the band-gap of the active photon-absorbing layer 13, 13A, 23 or 33. $\Delta$ indicates the valence band offset between the barrier layer 12, 12A, 16, 16A, 26 or 34 and the active photon-absorbing layer 13, 13A, 23 or 33 (positive when the valence band of the barrier layer is highest in energy). Finally, 4 is the valence band offset between the contact-layer 11, 21, 35 or 39 and the barrier layer 12, 12A, 16, 16A, 26 or 34 (positive when the valence band of the contact layer is highest in energy).

3. When the photo-detector of the invention is biased to its maximum operating bias with an externally applied voltage, the bands in the photon absorbing layer 13, 13A, 23 or 33 are flat right up to the barrier layer 12, 12A, 16, 16A, 26 or 34, and the valence band edge of the photon absorbing layer lies below that of the contact layer 11, 21, 35 or 39. The photo-detector will also work at slightly lower bias values, when the edge of the photon absorbing layer next to the barrier layer can become accumulated.

Figure 2A:
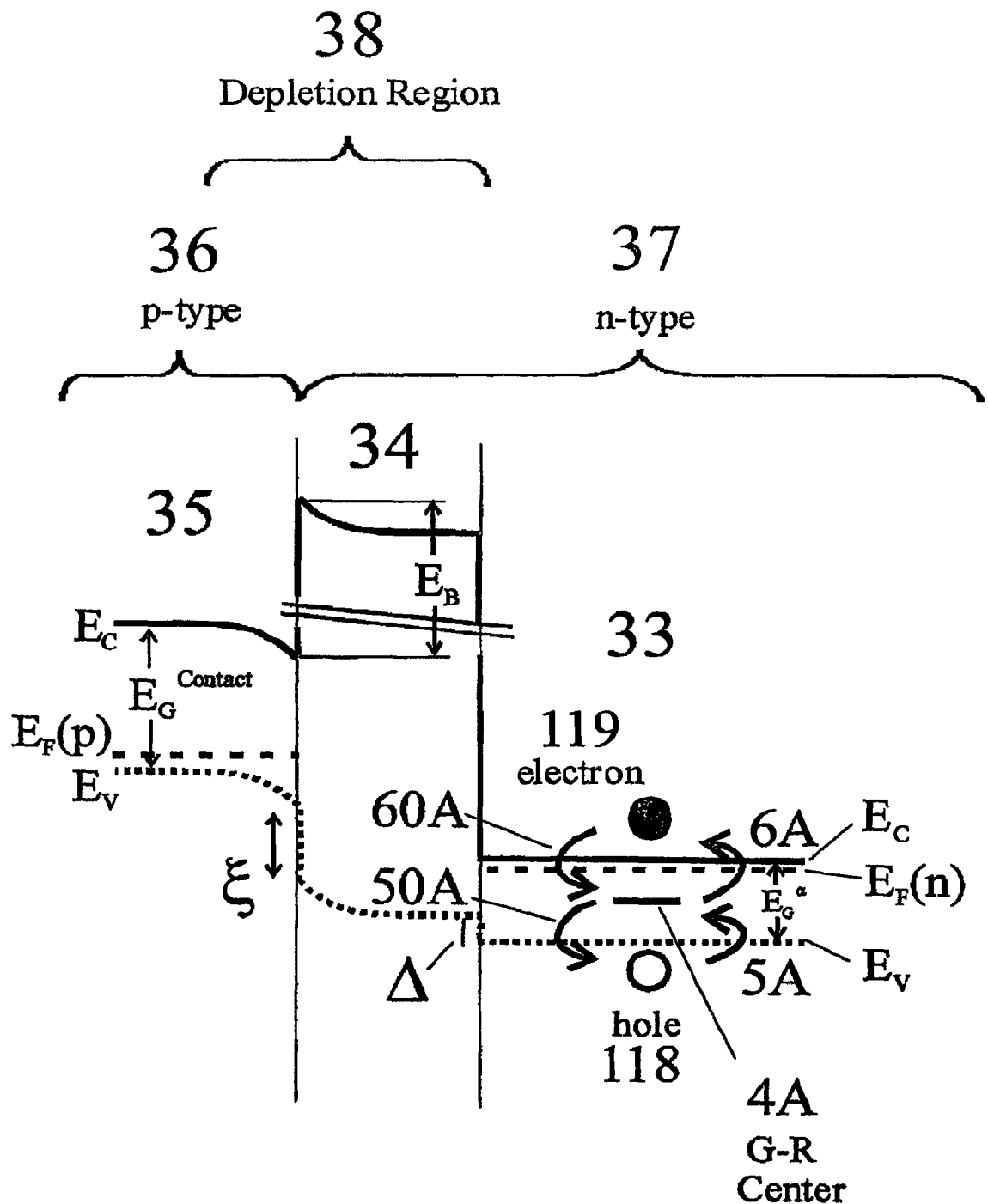
FIG. 2a shows an exemplary energy band diagram of a reduced dark current photodetector corresponding to an embodiment of the present invention, in which the depletion region is removed from the narrow bandgap, n-type, photon absorbing material. The thermal generation and recombination of electrons by a near mid-gap G-R center is demonstrated in the narrow bandgap photon absorbing material.
Figure 2B:
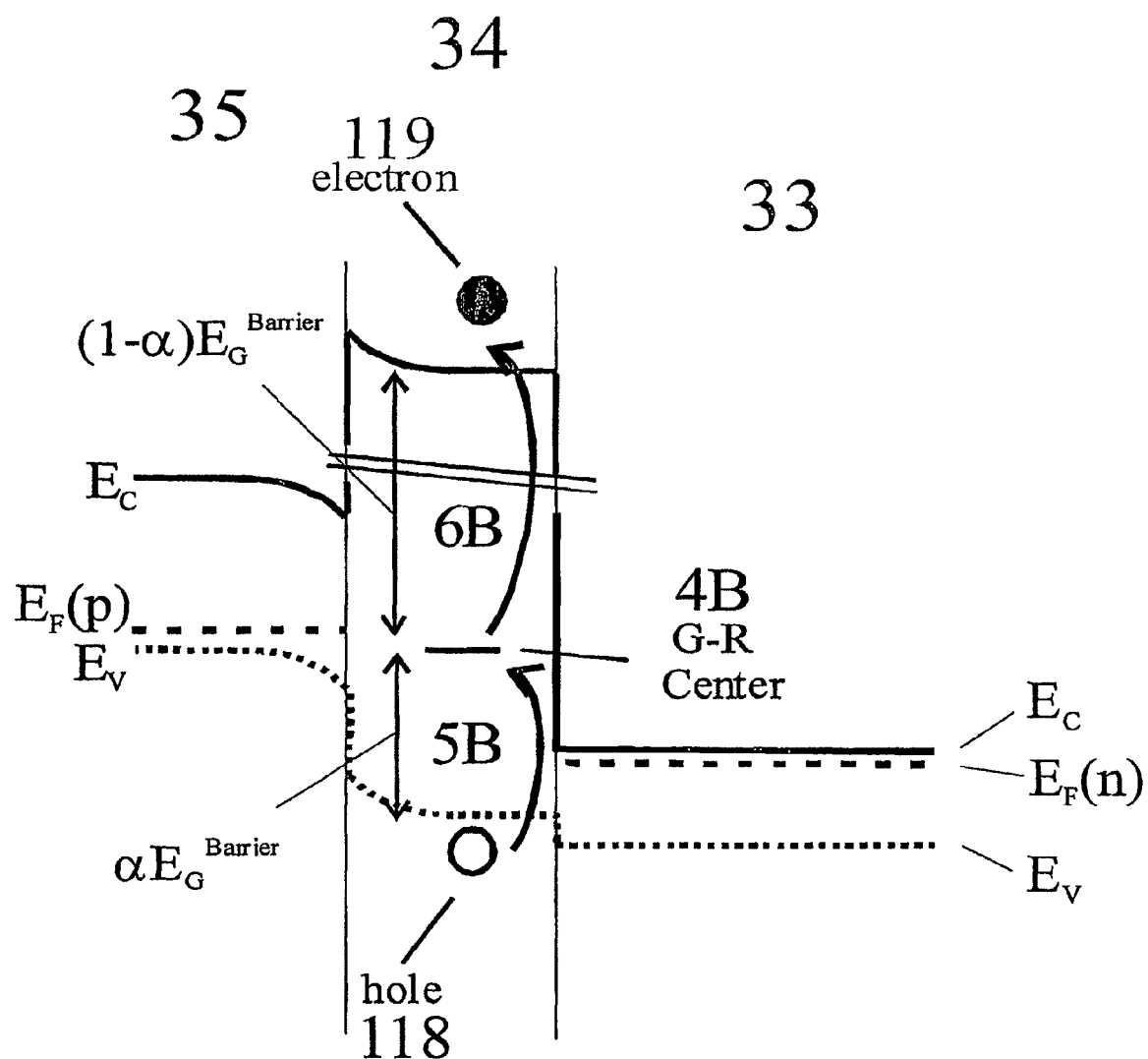
FIG. 2b shows the same energy band diagram as FIG. 2a. The thermal generation of electrons by a G-R center in the bandgap of the wide bandgap barrier material is demonstrated. The wide bandgap barrier material also contains part of the depletion region.

4. During operation at maximum bias, an electric field and associated depletion region is allowed only in the contact-layer 11, 21, 35 or 39 and in the barrier layer 12, 12A, 16, 16A, 26 or 34 but not in the active photon-absorbing layer 13, 13A, 23 or 33. This is shown schematically for a p-n-n device in FIG. 2a where the contact layer 35 is doped p-type 36 and the barrier layer 34 and the active photon absorbing layer 33 are doped n-type 37. In FIG. 2a the device is biased so that a depletion region 38 exists only in the barrier 34 and contact 35 layers but not in the active photon absorbing layer 33. Hence, as shown schematically in FIG. 2a, the rate of generation 5A, 6A due to a G-R center 4A in the active photon absorbing layer 33 is very similar to the rate of recombination 60A, 50A. It is also strongly suppressed due to the presence of majority carriers in the photon absorbing layer 33. In this case, equation (1) roughly describes the Generation rate, but with n' replaced by the donor concentration, $N_D$. The G-R contribution to the dark current from the active photon-absorbing layer 13, 13A, 23 or 33 is in fact comparable to the diffusion dark current from this layer. The current flowing from this layer 13, 13A, 23 or 33 into the barrier layer 12, 12A, 16, 16A, 26 or 34 is therefore essentially diffusion limited.

5. The band-gap of the barrier-layer 12, 12A, 16, 16A, 26 or 34 is larger than that of the photon absorbing layer 13, 13A, 23 or 33. Ideally, it is at least twice that of the active photon-absorbing layer 13, 13A, 23 or 33, in which case the following equation will hold:

$$\exp(-E_G^{Barrier}/2kT) \leq \exp(-E_C^\alpha/kT) \quad (4)$$

wherein $E_G^{Barrier}$ indicates the band-gap of the barrier-layer 12, 12A, 16, 16A, 26 or 34. As shown schematically in FIG. 2b for a barrier layer 34, G-R processes like 5B or 6B due to a G-R center 4B are activated respectively by energies $\alpha E_G^{barrier}$ and $(1-\alpha)E_G^{barrier}$. Since the theory presented earlier teaches that the G-R dark current in the barrier material is significant only when the G-R center is near the middle of the gap of the barrier material ($\alpha \approx \frac{1}{2}$ in FIG. 2b), the G-R dark current will then vary as: $\exp(-E_G^{Barrier}/2\,kT)$. Hence, the inequality in equation (4) means that the G-R dark current contribution from the barrier-layer 12, 12A, 16, 16A, 26 or 34 should be comparable with, or less than the total contribution to the dark current due to the active photon-absorbing layer 13, 13A, 23 or 33, which is diffusion limited as explained in the fourth item above, and varies as $\exp(-E_G^\alpha/kT)$.

6. For the p-type contact layer 11, 21, 35 or 39 the doping is quite high ($p \sim 1$-$10 \times 10^{17}\,cm^{-3}$), both to minimize the amount of band bending in the contact layer and also to reduce the concentration of minority electrons 119 in this layer.

Figure 2C:
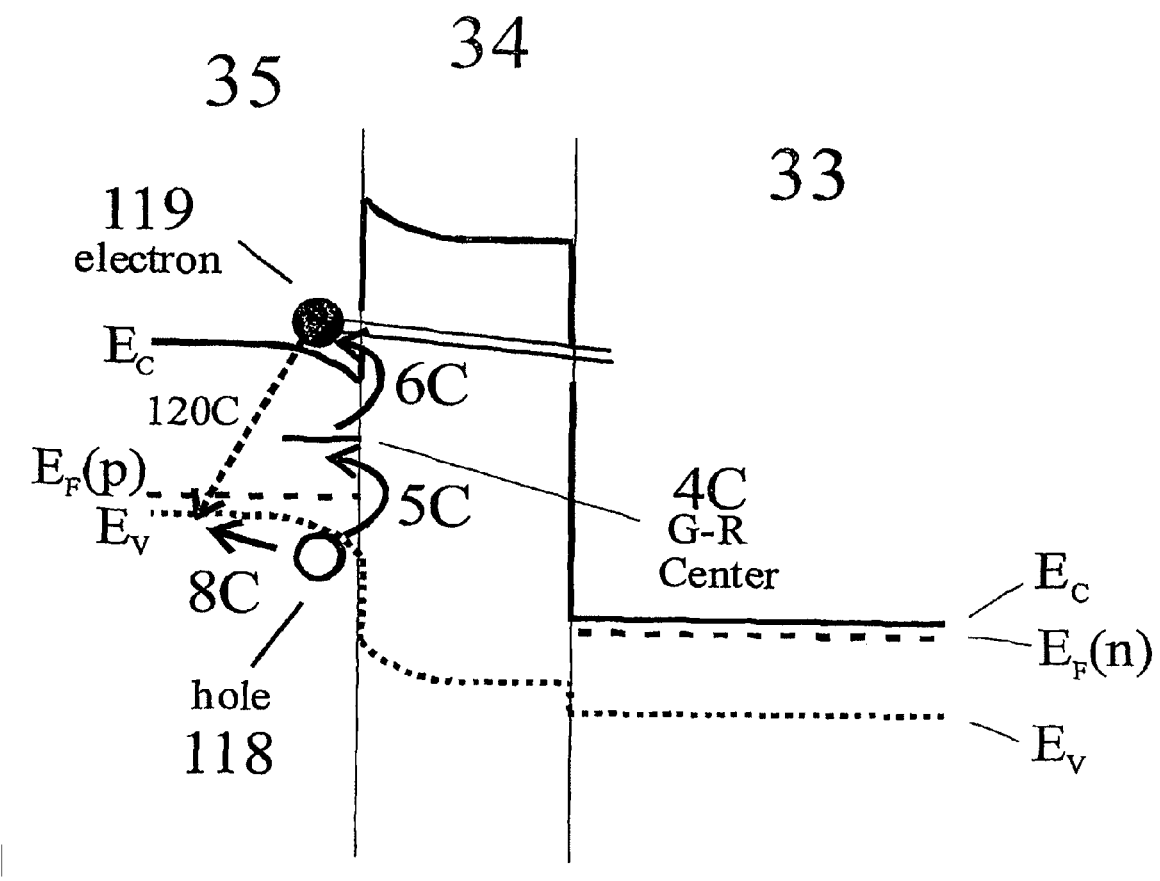
FIG. 2c shows the same energy band diagram as FIG. 2a. The thermal generation of electrons by a near mid-gap G-R center is demonstrated in the p-type contact material, which also contains part of the depletion region. The drift of a thermally generated hole is also shown as is the recombination of a thermally generated electron with a majority hole.
Figure 2D:
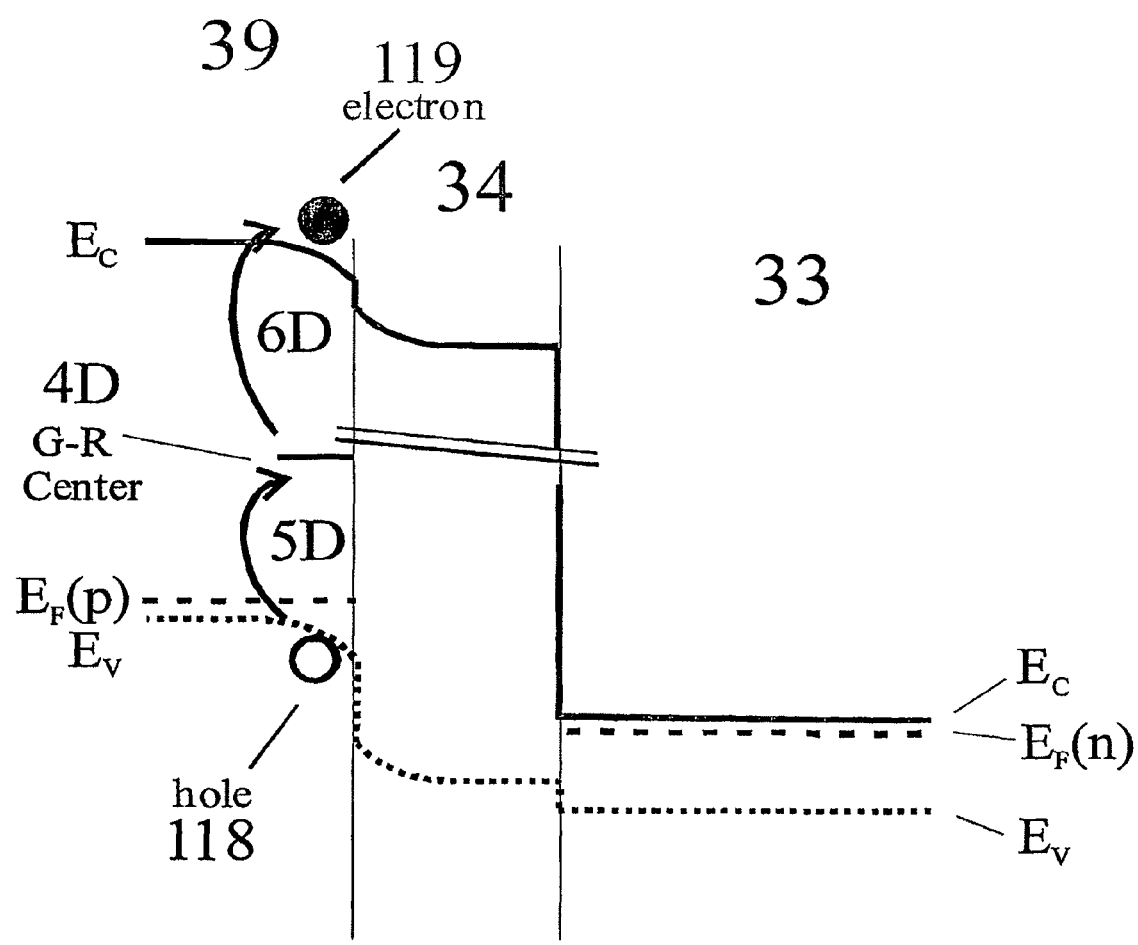
FIG. 2d shows the same energy band diagram as FIG. 2a, except that the bandgap of the p-type contact material is increased so that its conduction band lies above, rather than below, the conduction band of the barrier material. The thermal generation of electrons by a near mid-gap G-R center is demonstrated in the p-type contact material, which also contains part of the depletion region.

7. For the p-type contact layer 11, 21, 35 or 39 its valence band either lies below its own conduction band OR lies below the conduction band of the barrier layer 12, 12A, 16, 16A, 26 or 34 by more than the bandgap energy, $E_G^\alpha$, of the photon absorbing layer 13, 13A, 23 or 33. Ideally, the valence band of the p-type contact layer 11, 21, 35 or 39 should lie at least $2E_G^\alpha$ below its own conduction band OR below the conduction band of the barrier layer 12, 12A, 16, 16A, 26 or 34. Mathematically, this is expressed as: $E_G^{Contact} + E_B > 2E_G^\alpha$ if $E_B \gg 0$ OR $E_G^{Contact} > \alpha E_G^\alpha$ if $E_B \leq 0$, where $E_G^{Contact}$ is the bandgap of the contact material 35 and $E_B$ is the barrier height for electrons going from the contact layer 35 into the barrier layer 34 ($E_B$ is also the conduction band offset between the barrier 34 and contact 35 materials and is positive when the conduction band of the barrier layer 34 lies above the conduction band of the contact layer 35). In general, the activation energy for electrons passing from the contact layer 11, 21, 35 or 39 into the barrier layer 12, 12A, 16, 16A, 26 or 34 will then be greater than $E_G^\alpha$, even when G-R centers are present in the contact layer 11, 21, 35 or 39. Under these circumstances, the current due to this process will be less than the diffusion current from the photon absorbing layer 13, 13A, 23 or 33 which also has an activation energy of $E_G^\alpha$. Two configurations of the contact layer are shown schematically in FIGS. 2c and 2d. In FIG. 2c the conduction band of the contact layer 35 lies below the conduction band in the barrier layer 34 by more than about $10\,kT_{op}$. Any minority electrons generated in processes 5C or 6C by G-R centers 4C in the contact layer 35 are blocked by the barrier 34. They will either be thermally excited over the barrier, although this has a low probability, or they will eventually recombine 120C by various mechanisms with majority holes in the contact layer 35. FIG. 2d shows an alternative scenario when the blocking mechanism exemplified in FIG. 2c is absent. In this scenario, the conduction band of the contact layer 39 either lies above the conduction band in the barrier layer 34 ($E_B < 0$), or just a few times $kT_{op}$ below it ($E_B \approx 0$). In this case the bandgap of the contact layer 39 is greater than that of the photon absorbing layer 33, $E_G^{Contact} > E_G^\alpha$, so that generation of electrons 5D, 6D by G-R centers 4D in the contact layer 39 will be suppressed due to its large bandgap. The generation current from the contact will roughly vary as: $\exp(-E_G^{Contact}/2\,kT)$. This is smaller than the diffusion dark current from the photon absorbing layer 33 if, as is often the case: $E_G^{Contact} > 2E_G^\alpha$. This mechanism is the same as that which suppresses electron and hole generation in the barrier layer 12, 12A, 16, 16A, 26 or 34 as already explained in the fifth item above.

Furthermore, the thickness of the barrier layer 12, 12A, 16, 16A, 26 or 34 is made to be sufficiently thick to suppress any tunnel current of electrons from the valence band of the p-type contact layer 11, 21, 35 or 39 to the conduction band of the active photon absorbing layer 13, 13A, 23 or 33. Any such tunnel current must be less than the dark current in the diode due to other processes.

The doping of the barrier layer 12, 12A, 16, 16A, 26 or 34 and p-type contact layer 11, 21, 35 or 39 is chosen according to the present invention to adjust the operating bias to a desirable value. A n-type δ-doping layer 15, 15A or 25 may also be included between the photon absorbing layer 13, 13A, 23 or 33 and the barrier layer 12A, 16, 16A, 26 or 34. This can sometimes increase the range of bias over which the bands of the active photon-absorbing layer 13, 13A, 23 or 33 remain flat, even close to the junction with the barrier layer 12A, 16, 16A, 26 or 34.

Figure 3:
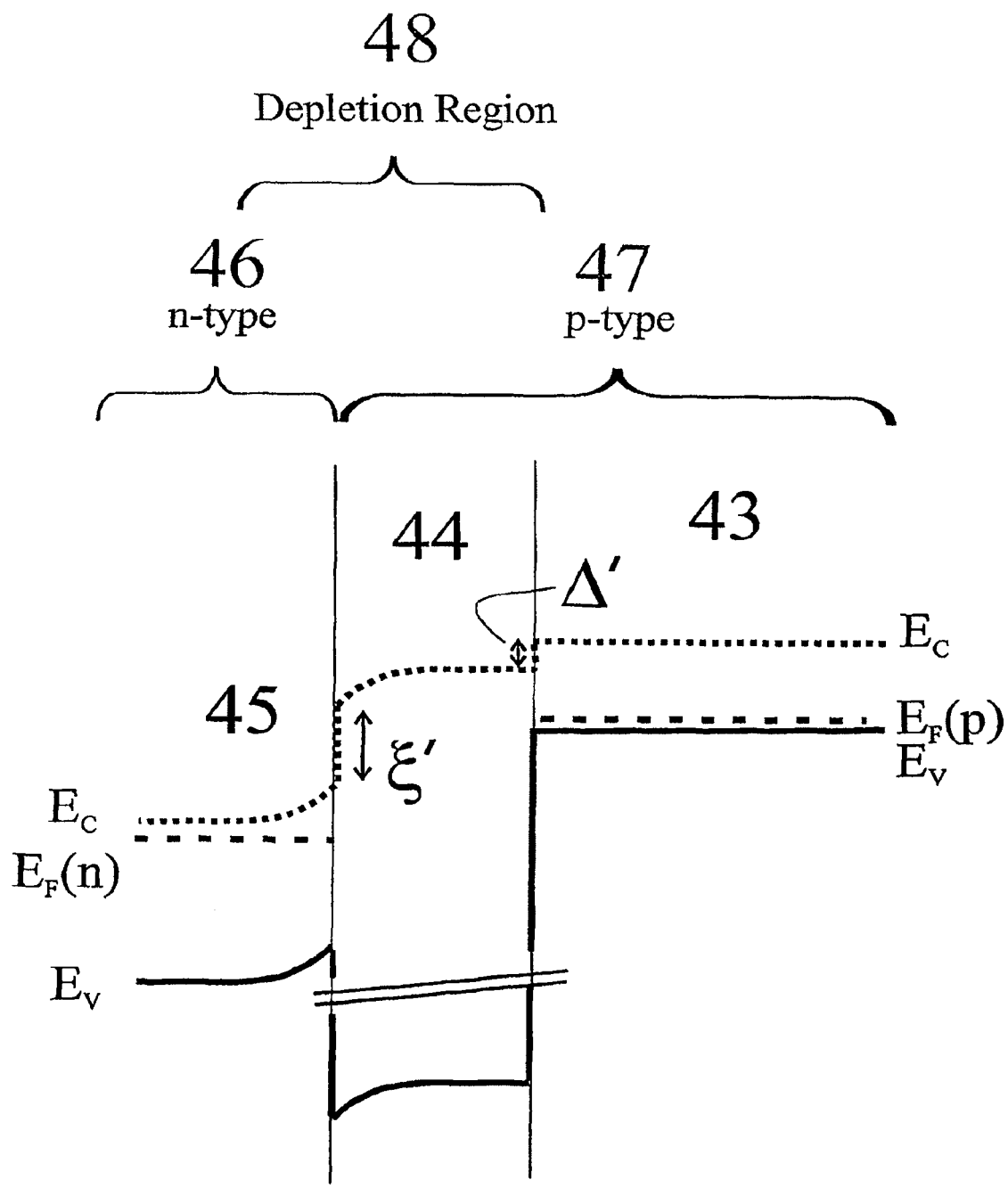
FIG. 3 exemplifies the band diagram of an essential part of one possible embodiment of the hetero-junction photo-detector of the present invention, in which the doping polarities of the photon absorbing, barrier, and contact layers have been reversed compared with the embodiment in FIGS. 2a-2d.

The principles of the present invention described above also apply to inverted polarity structures of the form n-n-p or n-p-p in which all the doping polarities and band alignments described above are reversed. An example is shown in FIG. 3 of an n-p-p structure that is the reversed form of the p-n-n structure depicted in FIGS. 2a-2d. The photon absorbing layer 43 is p-type 47 while the contact layer 45 is n-type and barrier layer 44 is p-type. Characterizing item 2 above, applies to all inverted polarity structures if the following words are interchanged: "highest" with "lowest", "higher" with "lower", "valence" with "conduction" and "above" with "below". The mathematical expression in the characterizing item 2 above is then replaced by $E_G^{\alpha\prime} - \Delta' \geq 0$ and $\xi' \geq 0$ if $\Delta'$ is positive or $\xi' + \Delta' \geq 0$ and $\Delta' + 10\,kT_{op} \geq 0$ if $\Delta'$ is negative. $E_G^{\alpha\prime}$ indicates the band-gap of the active photon-absorbing layer, such as 43. $\Delta'$ indicates the conduction band offset between the barrier layer, such as 44, and the active photon-absorbing layer, such as 43 (positive when the conduction band of the barrier layer is lowest in energy). $\xi'$ is the conduction band offset between the contact-layer, such as 45, and the barrier layer, such as 44 (positive when the conduction band of the contact layer is lowest in energy). During operation at maximum applied bias, an electric field and associated depletion layer is not allowed in the active photon absorbing layer, such as 43. The photo-detector will also work at slightly lower bias values, when the edge of the photon absorbing layer next to the barrier layer can become accumulated. The bandgap of the barrier layer, such as 44, is more than, and ideally twice, that of the active photon absorbing layer, such as 43. For the n-type contact layer, such as 45, either its conduction band lies above the valence band of the barrier layer, such as 44, by more than, and ideally twice, the band-gap energy, $E_G^{\alpha\prime}$, of the photon absorbing layer, such as 43 (this is depicted schematically in FIG. 3), or its bandgap is more than, and ideally twice, the bandgap of the photon absorbing layer, such as 43.

Embodiment 1

Figure 4A:
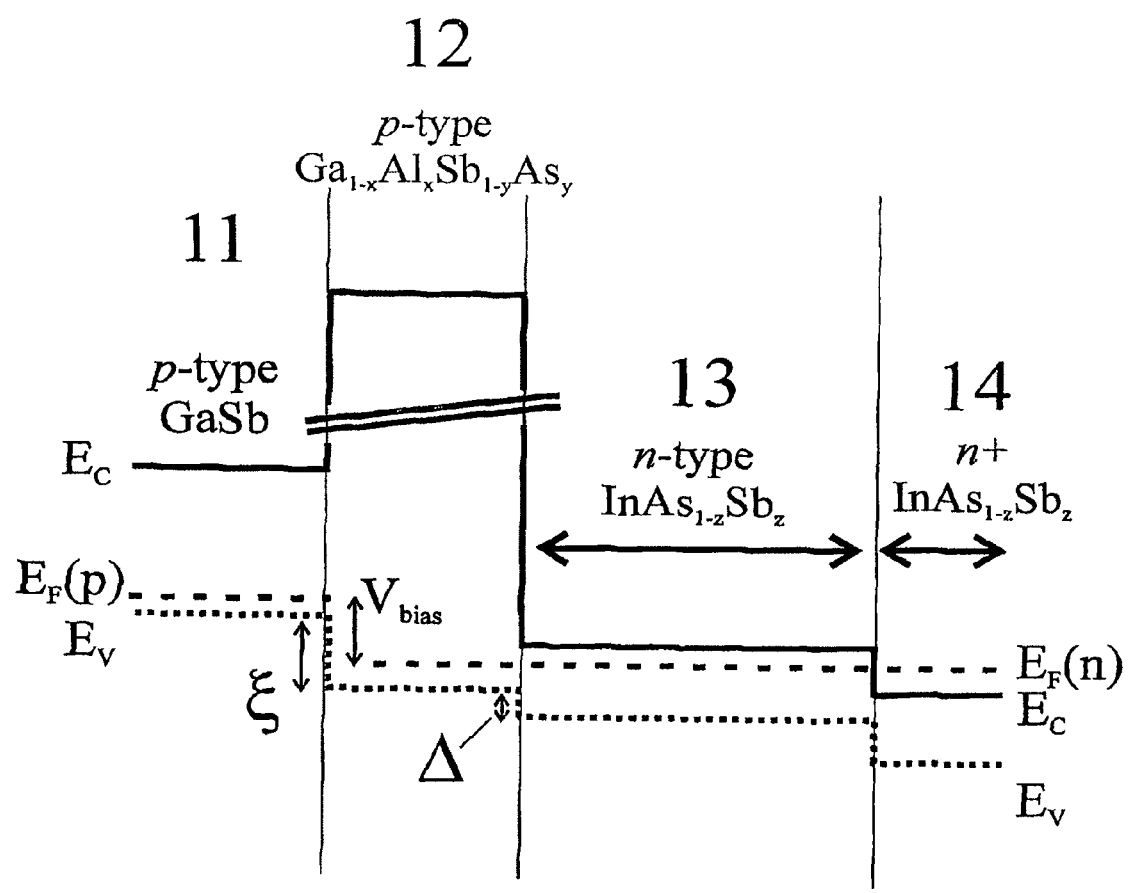
FIG. 4a shows the band diagram of a first embodiment of the hetero-junction photo-detector of the present invention, having an InAsSb photon absorbing layer.
Figure 4B:
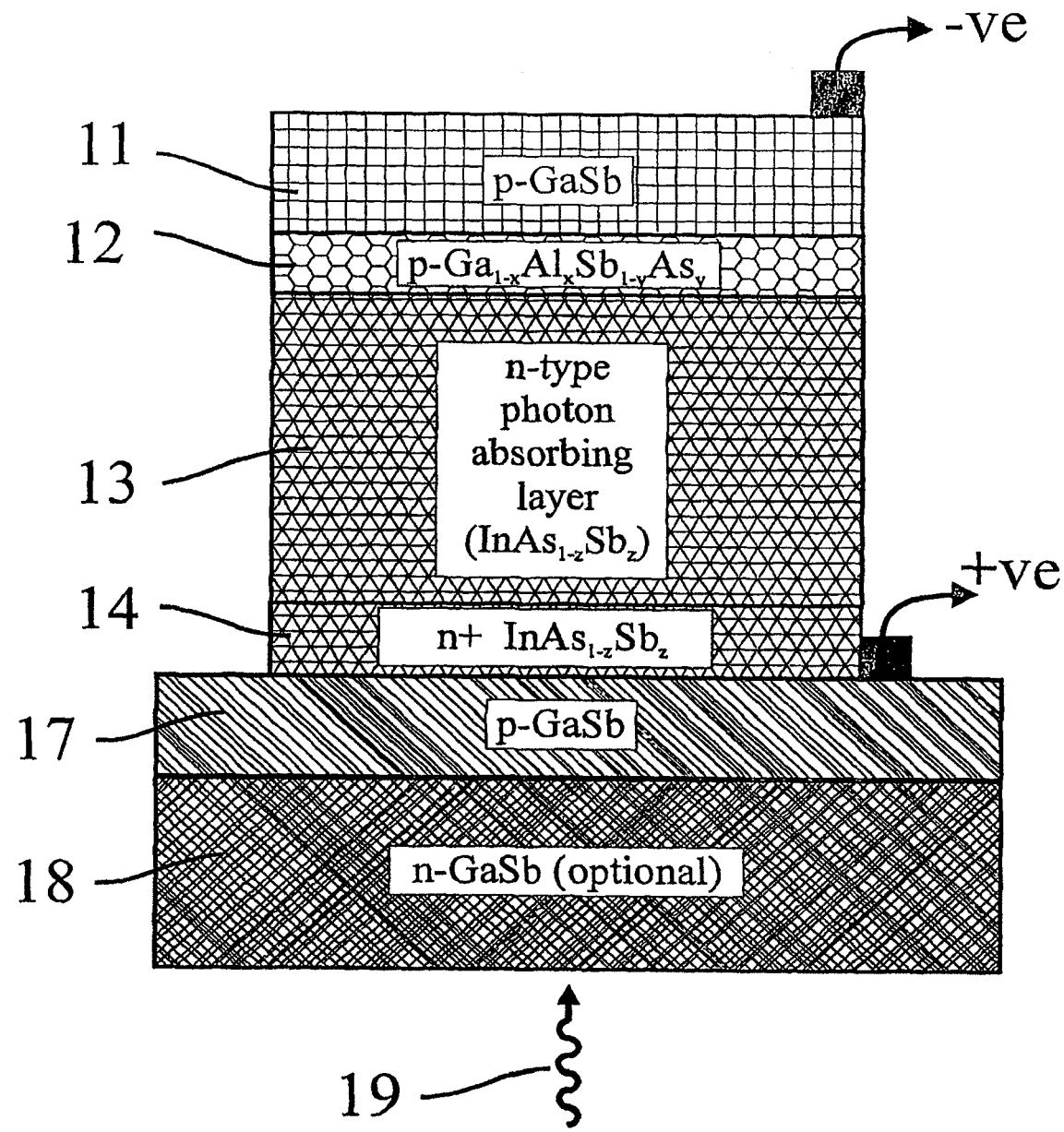
FIG. 4b illustrates in a schematic, cross-section form, the structure of a first embodiment of the heterojunction photo-detector with a photon absorbing layer based on InAsSb.

A band diagram of a photo-detector according to a first embodiment of the invention is shown in FIG. 4a. The structure of the photo-detector is shown in FIG. 4b. The n-type photon-absorbing layer 13 is made of InAsSb alloy. The doping is typically in the range of $n < 10^{16}$ cm$^{-3}$ and the thickness is typically in the range of 1-10 μm.

The use of InAsSb enables operation in the MWIR atmospheric transmission window (3-5μ). The contact layer 11 is made of p-type GaSb with typical values of doping in the range of $5 \times 10^{16} < p < 5 \times 10^{18}$ cm$^{-3}$ and thickness >0.5 μm.

The barrier layer 12 is made of GaAlSbAs alloy with thickness values typically in the range 0.05-1 μm.

As shown in FIG. 4a, the bands, during operation, are essentially flat in all the three layers of the heterostructure. This requires a very low p-type doping (typical values: $p < 10^{15}$ cm$^{-3}$) in the middle barrier layer 12.

Embodiment 2

Figure 5A:
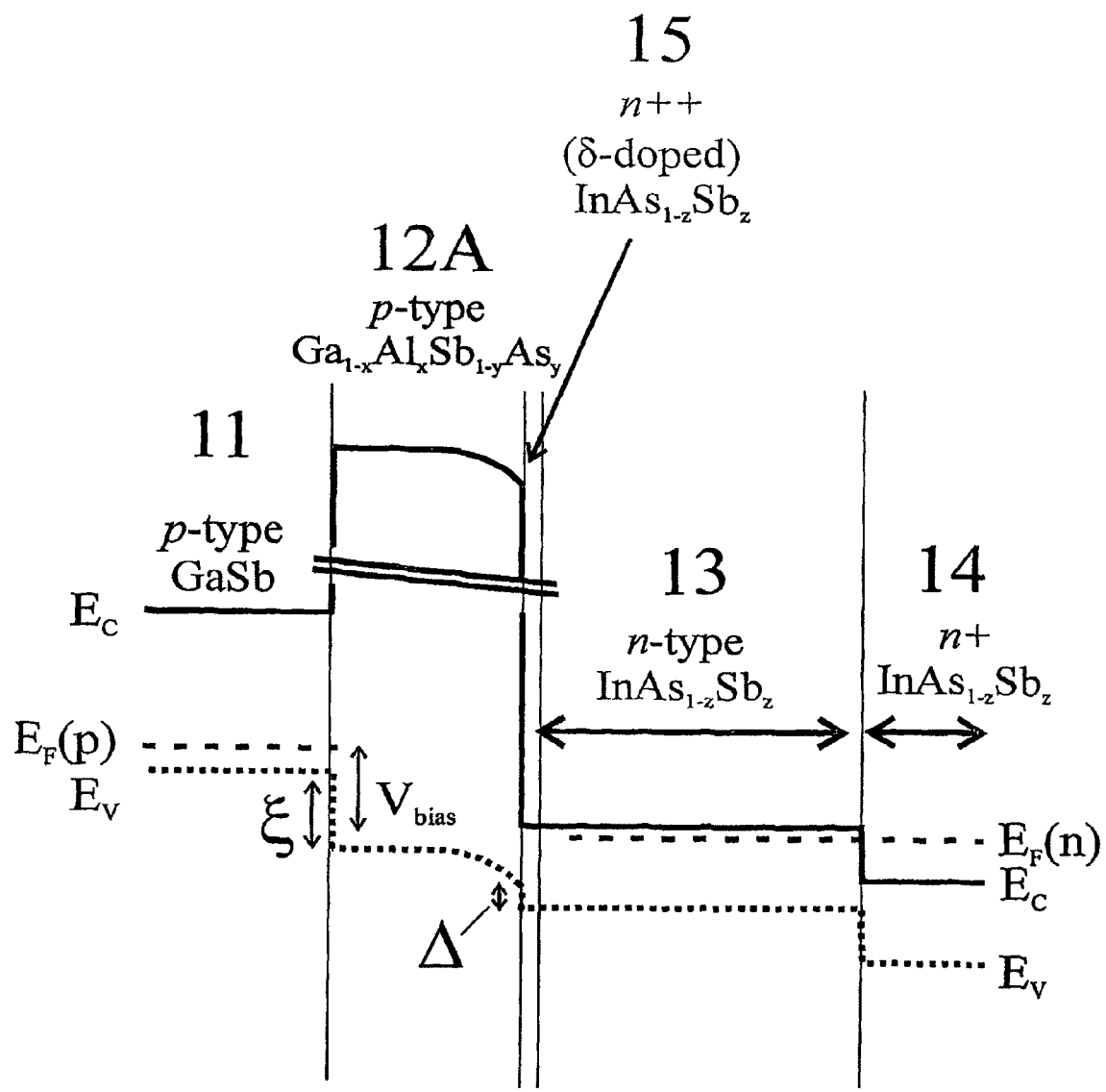
FIG. 5a shows the band diagram of a second embodiment of the hetero-junction photo-detector of the present invention, having an InAsSb photon absorbing layer.
Figure 5B:
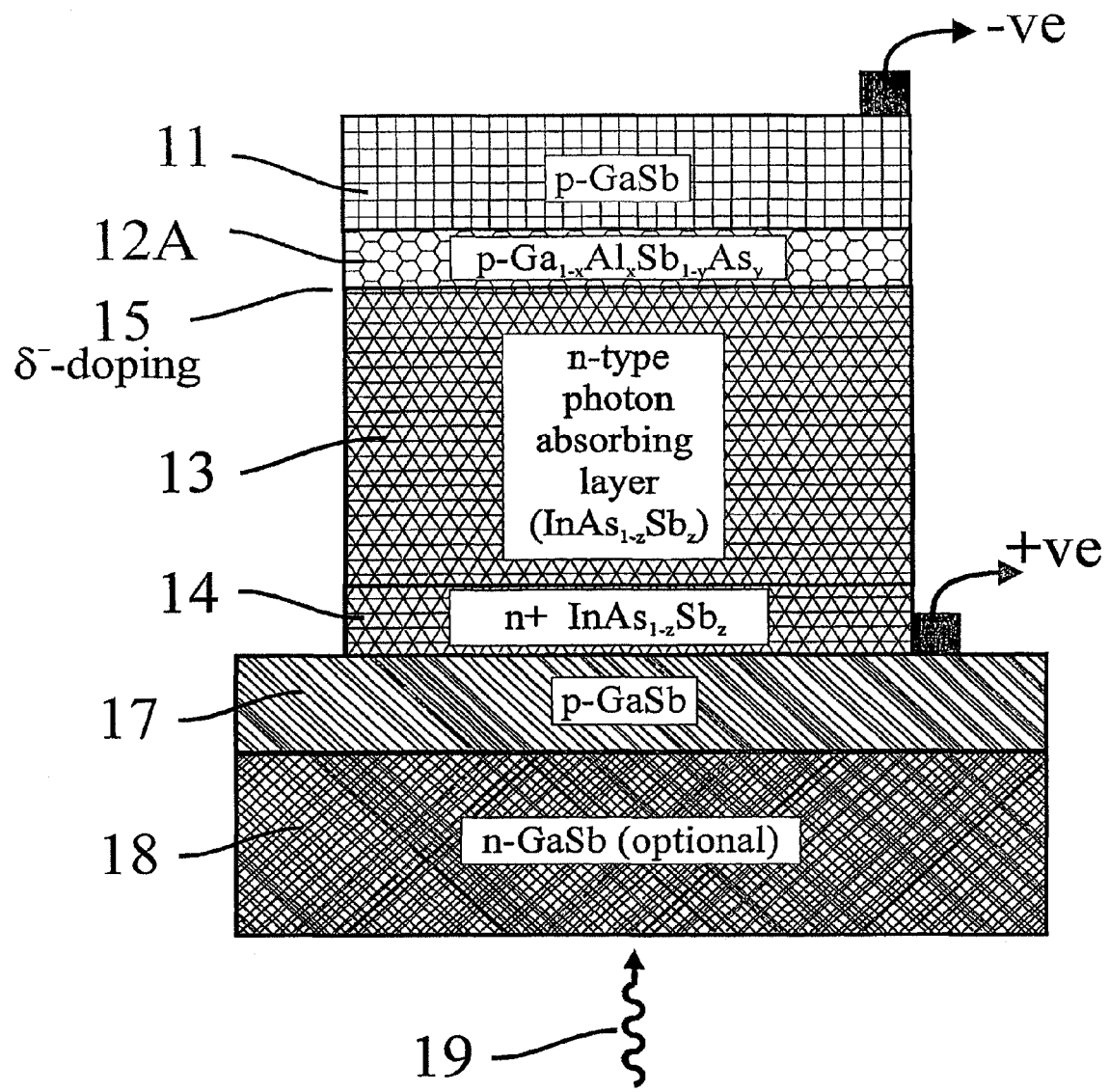
FIG. 5b illustrates in a schematic, cross-section form, the structure of a second embodiment of the heterojunction photo-detector with a photon absorbing layer based on InAsSb.

A band diagram of a second embodiment of the invention is shown in FIG. 5a. The structure of the second embodiment is shown in FIG. 5b. Unlike in embodiment 1, band bending is allowed in the barrier layer 12A. The n-type photon-absorbing layer 13 is made of InAsSb alloy. The doping is typically in the range, $n < 10^{16}$ cm$^{-3}$ and the thickness of the photon-absorbing layer 13 is typically in the range 1-10μ. The use of InAsSb enables operation in the MWIR atmospheric transmission window (3-5μ). The contact layer 11 is made of p-type GaSb with typical values of doping in the range $5 \times 10' < p < 5 \times 10^{18}$ cm$^{-3}$ and thickness >0.5μ.

The barrier layer 12A is made of GaAlSbAs alloy with thickness values typically in the range 0.05-1 μm. The barrier layer 12A is a p-type material, with a typical doping range of $1 \times 10^{15} \leq p < 5 \times 10^{16}$ cm$^{-3}$. A depletion region exists in the barrier layer 12A but not in the photon absorbing layer 13. The depletion region is usually confined to the barrier layer 12A but is allowed to extend a short distance into the p-type contact layer 11.

The boundary of the n-type photon absorbing layer 13 nearest the p-type barrier layer 12A is doped over one or two atomic monolayers with donor atoms such as, silicon, to form a δ-doping layer 15 having a typical doping of: $5 \times 10^{10} < n < $cm$^{-2}$).

Embodiment 3

Figure 6A:
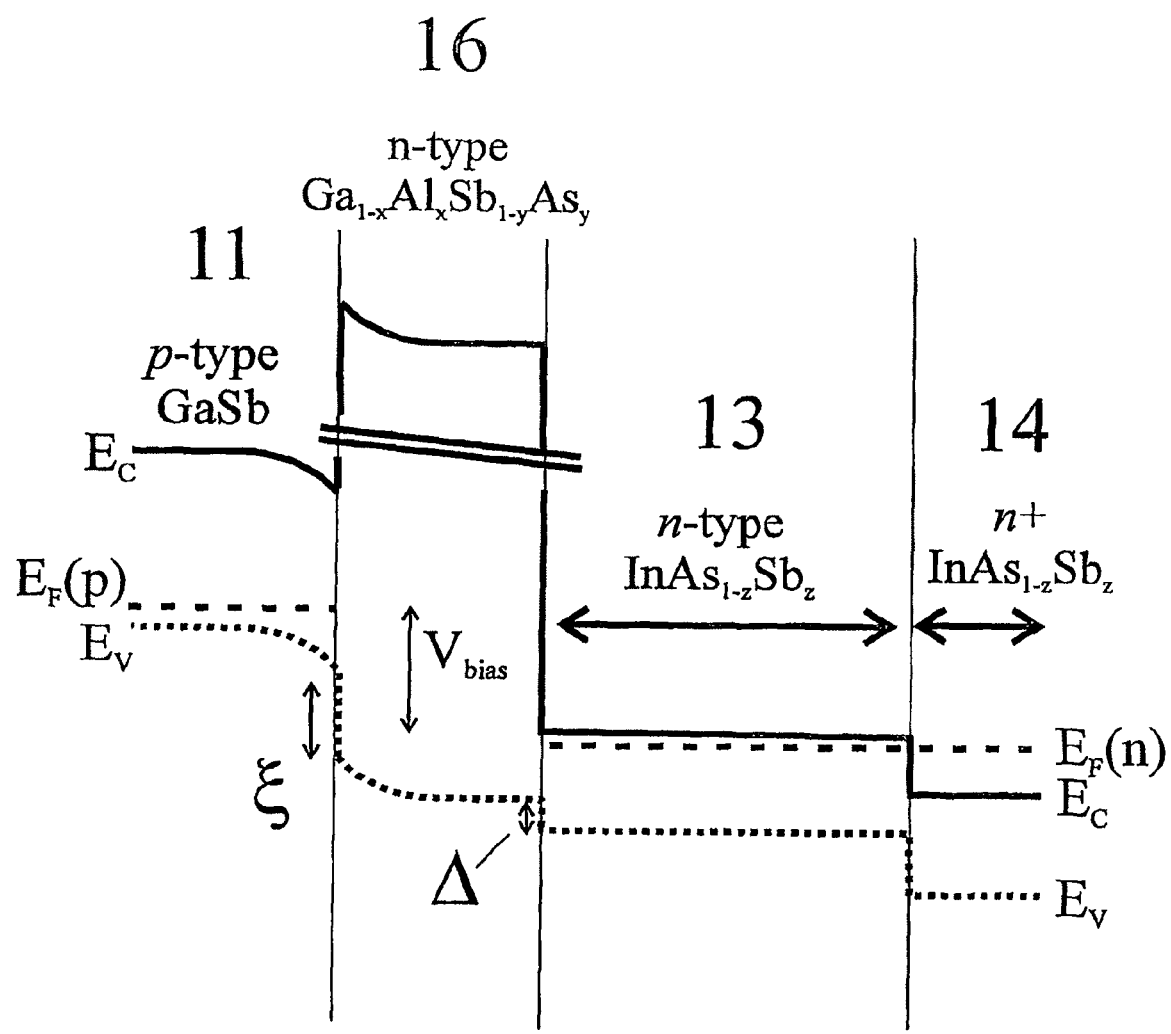
FIG. 6a shows the band diagram of a third embodiment of the hetero-junction photo-detector of the present invention, having an InAsSb photon absorbing layer.
Figure 6B:
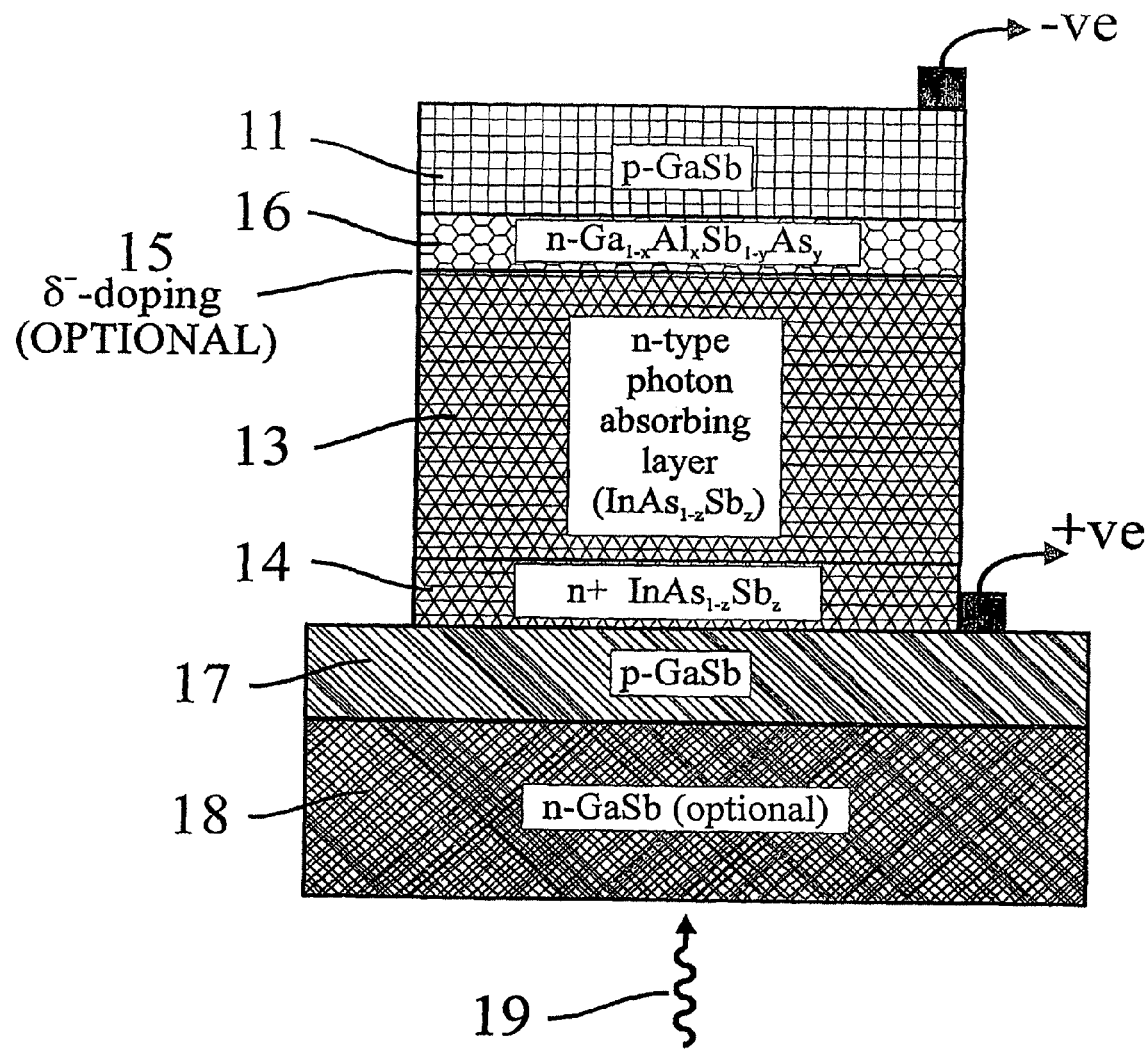
FIG. 6b illustrates in a schematic, cross-section form, the structure of a third embodiment of the heterojunction photo-detector with a photon absorbing layer based on InAsSb.

A band diagram of a third embodiment of the invention is shown in FIG. 6a. The structure of the third embodiment is shown in FIG. 6b. In the third embodiment, band bending is allowed in the barrier layer 16 and a short distance into the contact layer 11.

The n-type photon-absorbing layer 13 is made of InAsSb alloy. The doping is typically in the range of $n < 10^{16}$ cm$^{-3}$ and the thickness is typically in the range 1-10μ.

The use of InAsSb enables operation in the MWIR atmospheric transmission window (3-5μ).

The contact layer 11 is made of p-type GaSb with typical values of doping in the range $10^{17} < p < 5 \times 10^{18}$ cm$^{-3}$ and thickness >0.5μ.

The barrier layer 16 is made of GaAlSbAs alloy, with thickness typically in the range of 0.05-1 μm.

The barrier layer 16 is n-type with a typical doping range of $1 \times 10^{15} \leq n < 5 \times 10^{16}$ cm$^{-3}$.

A n-type δ-doping layer 15, having a typical doping of $5 \times 10' < n < 10^{12}$ cm$^{-2}$, may be included between the photon absorbing layer 13 and the barrier layer 16, as an option.

A depletion region exists in the barrier 16 and also a short distance into the p-type GaSb contact layer 11.

Embodiment 4

Figure 7A:
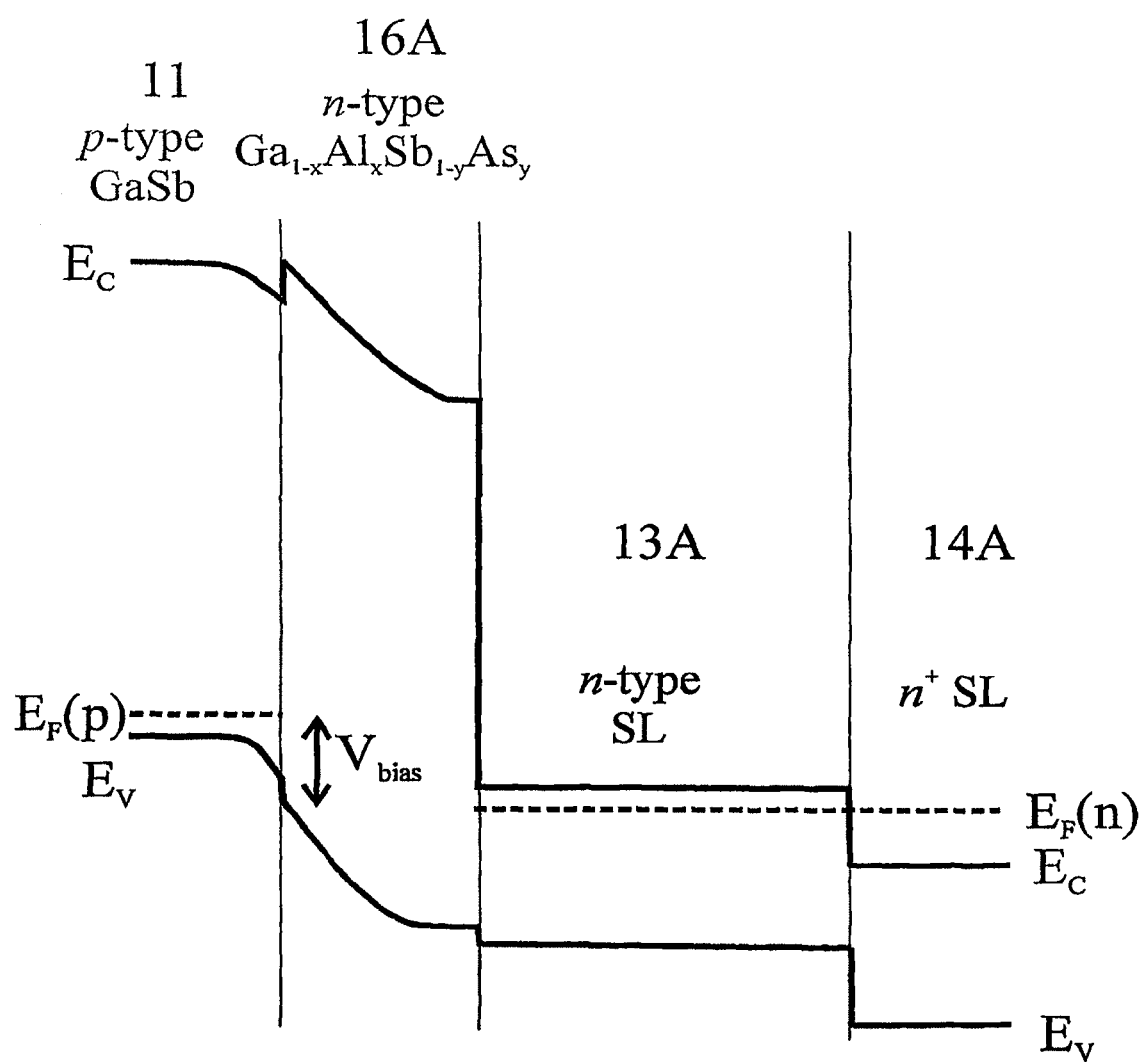
FIG. 7a shows the band diagram of a fourth embodiment of the hetero-junction photo-detector of the present invention, having a type II superlattice photon absorbing layer.
Figure 7B:
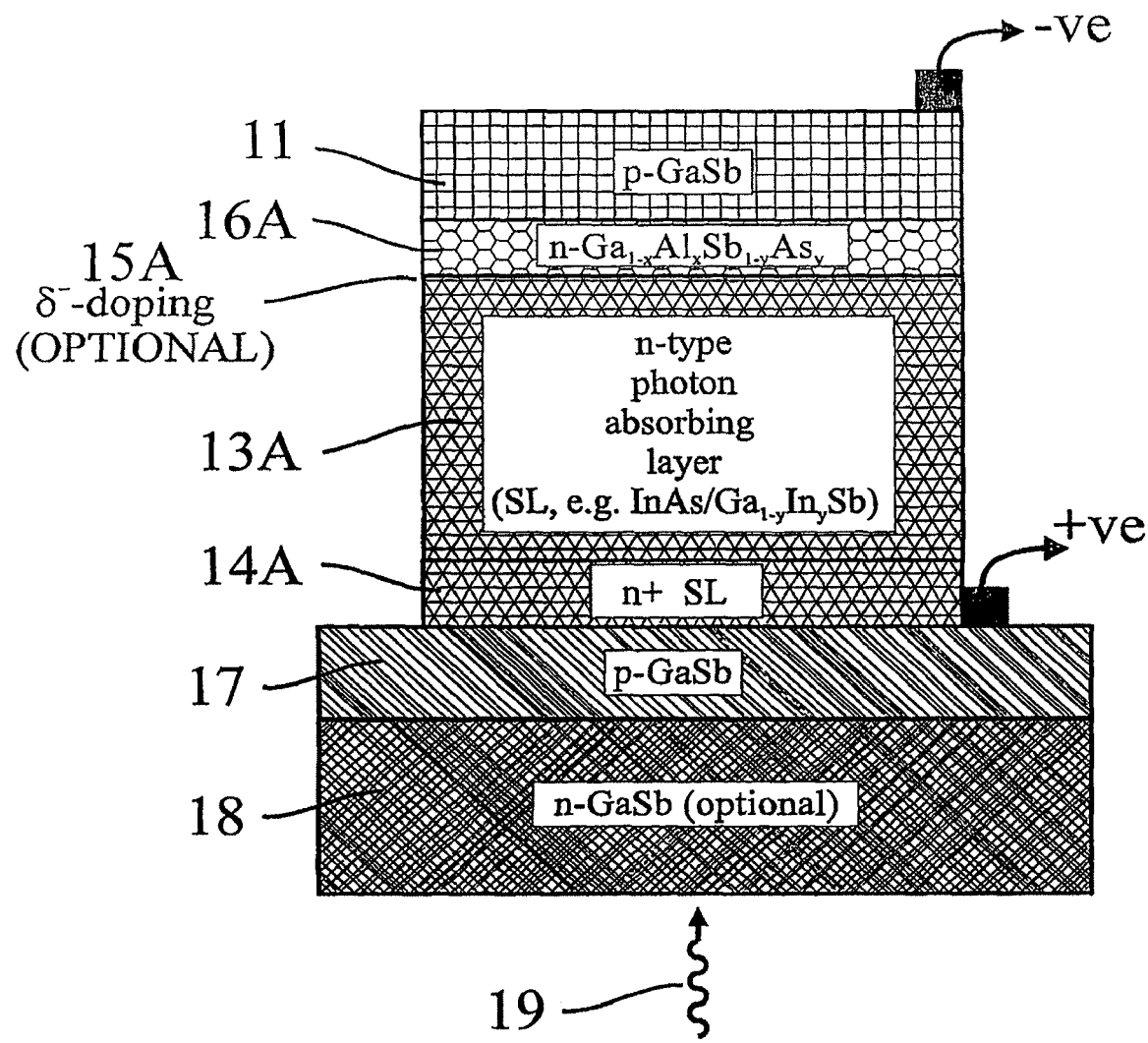
FIG. 7b illustrates in a schematic, cross-section form, the structure of a fourth embodiment of the heterojunction photo-detector with a photon absorbing layer based on a type II superlattice.

A band diagram of a fourth embodiment of the invention is shown in FIG. 7a. The structure of the fourth embodiment is shown in FIG. 7b.

The n-type photon-absorbing layer 13A is made of a type II superlattice that comprises alternating sub-layers of InAs and $Ga_{1-x}In_xSb$ (or alternating sub-layers of closely related semiconductor alloys, e.g. $InAs_{1-w}Sb_w$, $Ga_{1-x-y}In_xAl_ySb_{1-z}As_z$, etc. with $0 \leq w \leq 1, 0 \leq x \leq 1, 0 \leq y \leq 1, 0 \leq z \leq 1$ and $x+y<1$) and wherein the sub-layers each have a thickness typically in the range of 0.6-10 nm. The average doping over many sub-layers of the superlattice is typically in the range, $n<10^{16}$ cm$^{-3}$ and thickness of the whole superlattice region is typically in the range 1-10μ.

The use of a type II InAs/InGaSb (or closely related) superlattice 13A enables operation in both the Mid-Wave Infra-Red (MWIR: 3-5μ) and in the Long-Wave Infra-Red (LWIR: 8-12μ) terrestrial atmospheric transmission windows, and also in the Very Long-Wave Infra-Red (VLWIR: 12-20μ) range.

The contact layer 11 is made of p-type GaSb, with typical values of doping in the range $10^{17}<p<5\times10^{18}$ cm$^{-3}$ and thickness >0.5μ.

The barrier layer 16A is made of GaAlSbAs alloy with typical thickness values in the range 0.05-1 μm.

The barrier layer 16A is n-type with a typical doping range of $1\times10^{15} \leq n<5\times10^{16}$ cm$^{-3}$.

A n-type δ-doping layer 15A, having a typical doping of $5\times10^{10}<n<10^{12}$ cm$^{-2}$, may be included between the photon absorbing layer 13A and the barrier layer 16A, as an option.

As shown in FIG. 7a, depletion regions exist in both the n-type barrier 16A and the p-type GaSb contact layer 11.

Although the valence band offset (Δ in FIG. 2a) between the barrier layer 16A and the photon absorbing layer 13A is shown positive in FIG. 7a, it may be made negative up to a most negative value of about $-10 \text{ k } T_{op}$ by changing the amount of Aluminium and arsenic in the barrier.

Embodiment 5

Figure 8A:
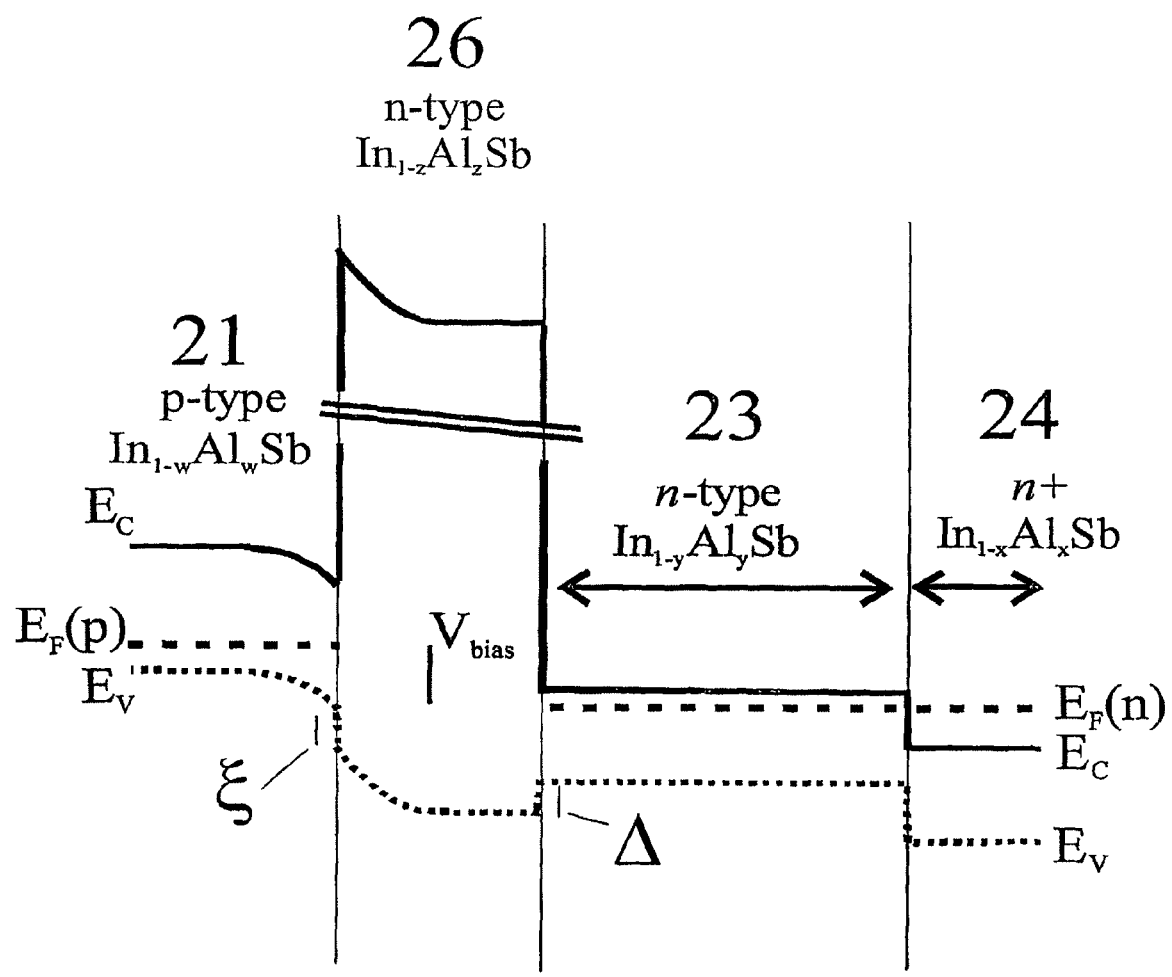
FIG. 8a shows the band diagram of a fifth embodiment of the hetero-junction photo-detector of the present invention, having a InAlSb photon absorbing layer.
Figure 8B:
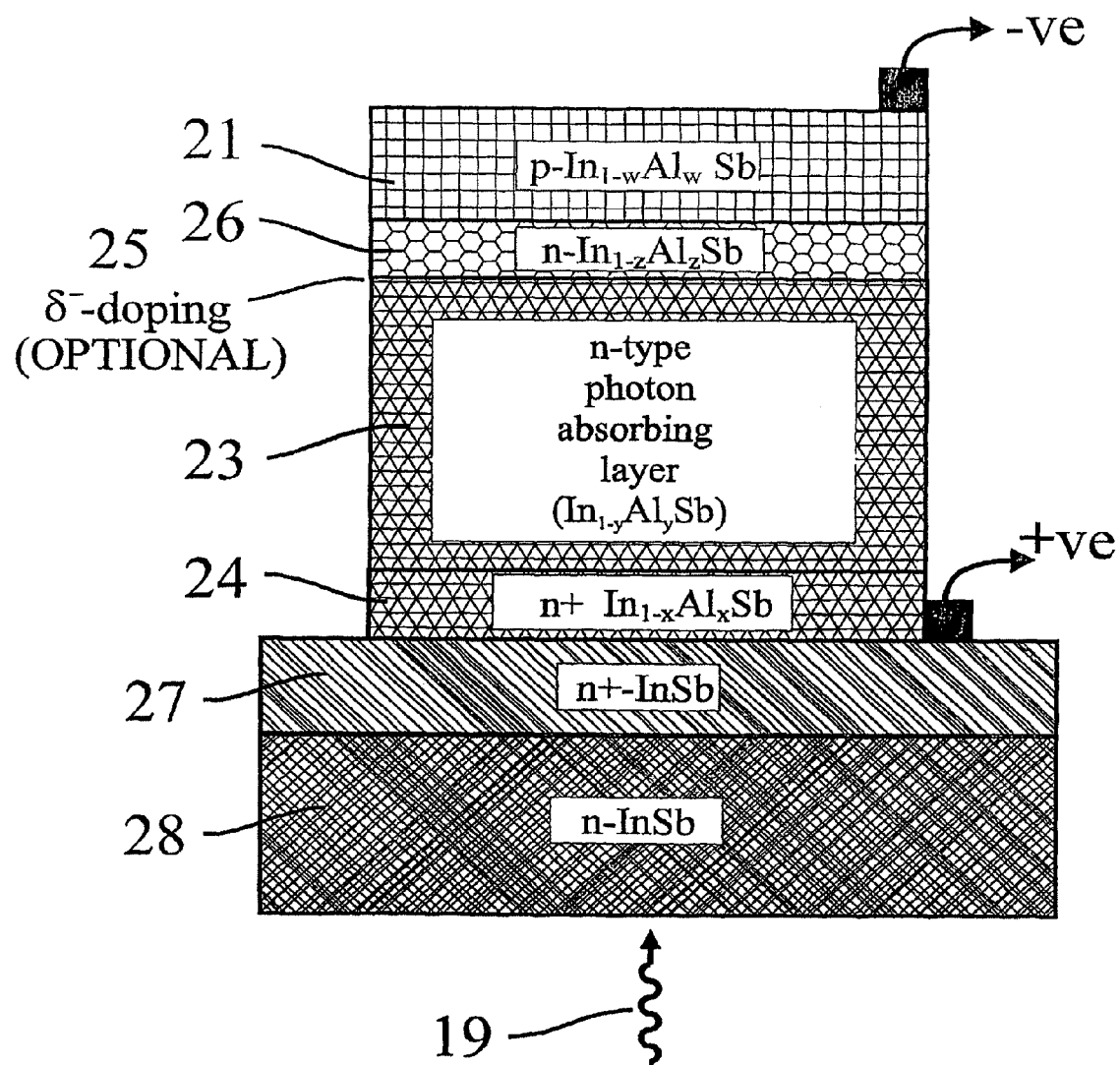
FIG. 8b illustrates in a schematic, cross-section form, the structure of a fifth embodiment of the heterojunction photo-detector with a photon absorbing layer based on InAlSb.

A band diagram of a fifth embodiment of the invention is shown in FIG. 8a. The structure of the fifth embodiment is shown in FIG. 8b.

The n-type photon-absorbing layer 23 is made of InSb or InAlSb alloy. The doping is typically in the range, $n<10^{16}$ cm$^{-3}$ and thickness is typically in the range 1-10μ.

The use of InSb or InAlSb alloy 23 enables operation in the MWIR atmospheric transmission window (3-5μ).

The contact layer 21 is made of p-type InSb or InAlSb alloy, with typical values of doping in the range $10^{17}<p<5\times10^{18}$ cm$^{-3}$ and thickness >0.5μ.

The barrier layer 26 is made of InAlSb alloy with typical thickness values in the range 0.05-0.3 μm.

The InAlSb barrier layer 26A is n-type with a typical doping range of $1\times10^{15} \leq n<5\times10^{16}$ cm$^{-3}$.

A n-type δ-doping layer 25, having a typical doping of $5\times10^{10}<n<10^{12}$ cm$^{-2}$, may be included between the photon absorbing layer 23 and the barrier layer 26, as an option.

A depletion region exists in the n-type InAlSb alloy barrier 26 and also a short distance into the p-type InSb or InAlSb alloy contact layer 21.

The valence band offset (Δ in FIG. 8a) between the InAlSb barrier layer 26 and the photon absorbing layer 23 is negative, and should be designed by changing the amount of Aluminium in the barrier to have a value of between $-3 \text{ kT}_{op}$ and $-10 \text{ kT}_{op}$. For growth of an InSb photon absorbing layer on an InSb substrate, and taking into account the strain splitting of the valence band in the barrier, which will make the valence band edge of the barrier layer 26 "light-hole" like in character, the typical Aluminium concentration in the barrier layer 26 will be about 10%-25% (e.g. for 10% the alloy composition is $In_{0.9}Al_{0.1}Sb$). The height of the barrier 26 in the conduction band may be less than the ideal value specified in characterizing features 5 and 7, but it still satisfies the basic requirements and provides strong suppression of the G-R dark current contribution from the contact layer 21.

Further Embodiments

In all embodiments, it is advantageous to join the boundary of the photon-absorbing layer 13, 13A, or 23 furthest from the barrier layer 12, 12A, 16, 16A, or 26 to a material 14, 14A or 24 of nearly the same composition as the photon absorbing layer material but with much higher n-doping (typical values: $n<3\times10^{18}$ cm$^{-3}$), so that the valence band of the highly doped layer lies below the valence band of the photon absorbing layer by significantly more than 3 $kT_{op}$. This can improve efficiency and electrical contact quality. However, it should be noted that layers 14, 14A or 24 are optional.

Embodiment 4 has a photon-absorbing layer based on a type II superlattice, and is closely analogous to embodiment 3, which has a photon-absorbing layer based on InAsSb alloy. Both of these embodiments have an n-type GaAlSbAs barrier layer and a p-type GaSb contact layer. It is clear that other variations can be devised with a photon-absorbing layer based on a type II superlattice, which have a p-type GaAlSbAs barrier and a p-type GaSb contact layer, analogous to embodiments 1 and 2.

In embodiment 4, the p-type GaSb contact layer could be replaced with a p-type type II superlattice layer with a similar bandgap energy to that of the photon absorbing layer.

Embodiment 5 has an n-type InSb or InAlSb alloy photon absorbing layer, together with an n-type InAlSb alloy barrier layer and a p-type InSb or InAlSb alloy contact layer. It is clear that other variations can be devised with a photon-absorbing layer based on n-type InSb or InAlSb alloy, which have a p-type InAlSb alloy barrier and a p-type InSb or InAlSb alloy contact layer, analogous to embodiment 2.

The following Table 1 provides some approximate band offset ranges for materials when grown on GaSb substrates:

TABLE 1

| | | Approx. Valence band offset (meV), Δ $\Delta = E_v(1) - E_v(2)$ | |
|---|---|---|---|
| Material 1 | Material 2 | Min | Max |
| AlSb | $InAs_{0.91}Sb_{0.09}$ | 30 | 200 |
| GaSb | $InAs_{0.91}Sb_{0.09}$ | 390 | 560 |
| GaSb | InAs/InGaSb superlattice | 30 | 100 |

Table 2 provides approximate bandgaps and cut-off wavelengths of Semiconducting materials at 77K that can be grown on GaSb substrates:

TABLE 2

| Layer number | Material | Composition range (x) | Approx. Bandgap (meV) | Approx. Cut-off wavelength (μm) |
|---|---|---|---|---|
| 11, 17 | GaSb | — | 800 | 1.55 |
| 12, 12A, 16 | $Ga_{0.5}Al_{0.5}Sb$ | — | 1560 | 0.80 |
| 12, 12A, 16 | AlSb | — | 1660 | (indirect gap) |
| 12, 12A, 16 | $Ga_{1-x}Al_xSb$ | 0-1 | 800-1660 | 1.55-0.74 |
| 13, 14, 15 | $InAs_{0.91}Sb_{0.09}$ | — | 310 | 4.0 |
| 13, 14, 15 | $InAs_{1-x}Sb_x$ | 0-0.2 | 410-260 | 3.0-4.8 |

TABLE 2-continued

| Layer number | Material | Composition range (x) | Approx. Bandgap (meV) | Approx. Cut-off wavelength (μm) |
|---|---|---|---|---|
| 13, 14, 15 | InAs/InGaSb superlattice | — | 60-400 | 3-20 |

The following Table 3 provides approximate band offset range information for materials when grown on InSb substrates:

TABLE 3

| | | Approx. Valence band offset (including strain effects) (meV), Δ $\Delta = E_V(1) - E_V(2)$ | |
|---|---|---|---|
| Material 1 | Material 2 | Min | Max |
| InSb | $In_{0.9}Al_{0.1}Sb$ | 20 | 40 |

Table 4 provides approximate bandgap and cut-off wavelength information of Semiconducting material at 77K that can be grown on InSb substrates:

TABLE 4

| Layer number | Material | Composition range (x) | Approx. Bandgap (including strain effects) (meV) | Approx. Cut-off wavelength (including strain effects) (μm) |
|---|---|---|---|---|
| 21, 23, 24, 26 | $In_{1-x}Al_xSb$ | 0-0.3 | 225-565 | 5.5-2.2 |

With reference to FIGS. 4b, 5b, 6b, 7b, and 8b, the semiconductor layers are usually grown by modern semiconductor epitaxy methods such as Liquid Phase Epitaxy (LPE), Molecular Beam Epitaxy (MBE), Metal-Organic Vapour Phase Epitaxy (MOVPE), or any of their derivatives, onto a semiconductor substrate (17, 18, or 28) [e.g. see "Growth and Characterization of Semiconductors", edited by R A Stradling and P C Klipstein, published by Adam Hilger (1990), ISBN 0-85274-131-6]. For embodiments 1-4, a good choice of substrate is GaSb doped either p-type 17 (e.g. p ~1-100× $10^{16}$ cm$^{-3}$) or n-type 18 (e.g. n ~1-100×$10^{16}$ cm$^{-3}$). An n-type GaSb substrate 18 is usually preferred for MWIR applications due to its lower free carrier absorption of the IR radiation. In this case a p-type GaSb buffer layer 17, which conveniently forms an Ohmic contact with n-type InAsSb [e.g. see P C Klipstein et al, in Semiconductor Hetero-Epitaxy, published by World Scientific, Singapore, page 515, ISBN 981 02 2479 6], may be grown on top of the n-type GaSb substrate. GaSb is closely lattice matched to the materials used for the other layers (11, 12, 12A, 13, 13A, 14, 14A, 15, 16 and 16A). Other choices of substrate 18 include InAs, GaAs, Si, Ge, and compliant substrates. For embodiment 5, a good choice of substrate is n-type InSb 28 (e.g. n ~1-3000× $10^{15}$ cm$^{-3}$). InSb is closely lattice matched to the materials used for the other layers (21, 23, 24, 26). An n+InSb buffer layer 27 should usually be grown (e.g. n ~5-30×$10^{17}$ cm$^{-3}$). The high doping can be chosen to make the layer nearly transparent to MWIR radiation by exploiting the Moss Burstein effect, as reported by T Ashley et al., in "Large Format MWIR Focal Plane Arrays", in SPIE proceedings vol. 4820, page 400. Other choices of substrate 28 include InAs, GaAs, Si, Ge, and compliant substrates.

After growth, the wafer is etched into a mesa structure, after which the sides are passivated with a suitable chemical treatment and/or with the application of a suitable dielectric layer (for example, silicon nitride) and electrical contacts are then applied. The substrate is usually thinned to allow light 19 to pass without significant losses due to free carrier absorption. Schematic arrangements are shown in FIGS. 4b, 5b, 6b, 7b and 8b.

It is a common practice, when producing focal plane array detectors, to make the top contact with an Indium Bump and to connect it to a pixel on a Silicon Read-Out Integrated Circuit (Si-ROIC). Note that in all embodiments of the structures shown in FIGS. 4b, 5b, 6b, 7b and 8b, the p-type region is grown after the n-type region of the diode and forms the top part of the mesa. The diode is then termed p-on-n and is designed to operate with the top of the mesa biased negative. The opposite polarity can be achieved by growing the structure appropriately so that the diode is n-on-p rather than p-on-n.

In order to make a "multi-color detector" that is sensitive to at least two different wavelength ranges, two or more detector units, each comprising a contact layer 11 or 21, a barrier layer 12, 12A, 16, 16A or 26, a photon-absorbing layer 13, 13A, or 23, a highly doped layer 14, 14A or 24 and possibly a delta-doping layer 15, 15A or 25 as described above can be stacked where each photon-absorbing layer 13, 13A or 23 has a different cut-off wavelength. The light 19 should enter the detector unit with the shortest cut-off wavelength first. Stacking is particularly easy when a single detector unit is terminated with GaSb on both sides, as in embodiments 1-4. With a stack of detector units, separate contacts are made to the boundary of each detector unit, noting that only one contact is needed at each junction of two detector units, since it can be shared by both units. It should be noted that although there are known publications referring, e.g. to HgCdTe material used to make stacked conventional p-n detectors (e.g p-n-p or p-n-p-n), the contacts, however, are never all to layers of the same doping type, as is possible in the present invention as one of the options.

If two units are stacked back to back, and no external contact is made at the common boundary between the two units, a two-color detector is achieved in which sequential operation is possible. The selection of the detection wavelength is according to the bias, since only the detector that is reverse biased should respond.

It should be noted that the suppression of the dark current (or noise) in the photo-detector, as achieved by the present invention reduces the Johnson and Schott noise in the detector at a given operating temperature, to a level significantly below the level of that which exists in a homo-junction detector made from the same photon absorbing material. An important consequence of the noise reduction is allowing the operating temperature of the photodetector, $T_{op}$, to be raised in comparison with that of a homo-junction detector made from the same photon absorbing material and operating with the same level of Johnson or Schott noise.

While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A photo-detector, comprising:
a heterostructure comprising
a first heterojunction comprising an n-type photon absorbing layer having an energy bandgap and a p-type middle barrier layer having an energy bandgap, said first heterojunction having an n-type δ-doping layer formed at the edge of the photon absorbing layer such that a p-n junction is formed between said barrier layer and said n-type δ-doping layer; and
a second heterojunction comprising the p-type middle barrier layer and a p-type contact layer,
the energy bandgap of the n-type photon absorbing layer being narrower than the energy bandgap of the middle barrier layer,
the first and second heterojunctions being configured to prevent creation of a depletion region in the n-type photon absorbing layer when a bias voltage is applied across the heterostructure, wherein
a tunnel current of electrons from the contact layer to the n-type photon absorbing layer is less than a dark current in the photo-detector, wherein the dark current from the photon absorbing layer to the barrier layer is essentially diffusion limited, and wherein generation recombination (GR) noise is reduced.

2. A photo-detector according to claim 1, wherein the layer materials are selected such that the middle barrier layer has an energy bandgap at least twice said energy bandgap of the photon absorbing layer, and wherein under flat band conditions a valence band edge of the contact layer lies below its own conduction band edge or below a conduction band edge of the barrier layer, by at least twice the bandgap energy of the photon absorbing layer.

3. A photo-detector according to claim 2, wherein the photon absorbing layer is an $InAs_{1-x}Sb_x$ alloy.

4. A photo-detector comprising stacked detector sub-units as in claim 3 in which each detector sub-unit has a different cut-off wavelength and in which each detector sub-unit is separated from its neighboring sub-unit by a p-type GaSb layer to which an external contact is made.

5. An array of detectors in which each detector is sensitive to more than one wavelength band as in claim 4, and in which each detector is connected to a silicon readout circuit using one indium bump or using one indium bump per detector sub-unit.

6. A photo-detector according to claim 2, wherein the photon absorbing layer is a type II superlattice material which comprises alternating sub-layers of $InAs_{1-w}Sb_w$ and $Ga_{1-x-y}In_xAl_ySb_{1-z}As_z$ with $0 \leq w \leq 1, 0 \leq x \leq 1, 0 \leq y \leq 1, 0 \leq z \leq 1$ and $x+y<1$ and wherein the sub-layers each have a thickness in the range of 0.6-10 nm.

7. A photo-detector according to claim 2, wherein the contact layer is GaSb.

8. A photo-detector according to claim 2, wherein the contact layer is a type II superlattice comprising alternating sub-layers of $InAs_{1-w}Sb_w$ and $Ga_{1-x-y}In_xAl_ySb_{1-z}As_z$ with $0 \leq w \leq 1, 0 \leq x \leq 1, 0 \leq y \leq 1, 0 \leq z \leq 1$ and $x+y<1$ and wherein the sub-layers have a thickness in the range of 0.6-10 nm.

9. A photo-detector according to claim 2, wherein the middle barrier layer is a $Ga_{1-x}Al_xSb_{1-y}As_y$ alloy with $0 \leq x \leq 1$ and $0 \leq y \leq 1$.

10. A photo-detector comprising stacked detector sub-units as in claim 2 in which each detector sub-unit has a different cut-off wavelength.

11. An array of detectors in which each detector is as in claim 2 is connected to a silicon readout circuit by an indium bump.

12. A photo-detector according to claim 1, wherein the layer materials are selected such that when biased with an externally applied voltage, the bands in the photon absorbing layer next to the barrier layer are flat or accumulated, such that a depletion region exists only in the barrier and contact layers but not in the photon absorbing layer and a valence band edge in any part of the photon absorbing layer lies below a valence band edge in any part of the contact layer and does not lie more than $10\,kT_{op}$ above the valence band edge in any part of the barrier layer, where k is the Boltzman constant and $T_{op}$ is the operating temperature.

13. A photo-detector according to claim 1, wherein the photon absorbing layer has a thickness of 1-10 μm and doping of $n<10^{16}\,cm^{-3}$.

14. A photo-detector according to claim 1, wherein the middle barrier layer has a thickness of between 0.05 and 1 μm.

15. A photo-detector according to claim 1, wherein the barrier layer is doped p-type, $p<5\times10^{16}\,cm^{-3}$, and the contact layer has a doping of $p<5\times10^{18}\,cm^{-3}$.

16. A photo-detector according to claim 1, wherein the n-type δ-doping layer has $5\times10^{10}<n<10^{12}$ donors $cm^{-2}$.

17. A photo-detector according to claim 1, wherein the photon absorbing layer is InSb or an $In_{1-x}Al_xSb$ alloy.

18. A photo-detector according to claim 1, wherein the contact layer is InSb or an $In_{1-x}Al_xSb$ alloy.

19. A photo-detector according to claim 1, wherein the middle barrier layer is an $In_{1-x}Al_xSb$ alloy.

20. A photo-detector according to claim 1, in which the n-type photon absorbing layer is terminated by a highly n-doped terminating layer, with $3\times10^{17}<n<3\times10^{18}$ donors $cm^{-3}$, and with thickness 0.5-4 μm, so that the valence band edge of said highly n-doped terminating layer lies below that in the next n-type photon absorbing layer.

21. A photo-detector comprising stacked detector sub-units as in claim 20 in which each detector sub-unit has a different cut-off wavelength and in which each detector sub-unit is separated from its neighboring sub-unit by a p-type GaSb layer to which an external contact is made.

22. An array of detectors in which each detector is sensitive to more than one wavelength band as in claim 21, and in which each detector is connected to a silicon readout circuit using one indium bump or using one indium bump per detector sub-unit.

23. A photo-detector according to claim 1, wherein one or more mesa structures are etched through the uppermost layer to a depth suitable for electrical isolation.

24. A photo-detector according to claim 23, in which the surfaces of each mesa structure exposed by the etch treatment undergo a chemical treatment after which a dielectric layer is applied, and wherein said dielectric layer has openings to allow the application of metal contacts.

25. A photo-detector according to claim 23, to which a dielectric layer is applied to the surfaces of each mesa structure exposed by the etch treatment, and wherein said dielectric layer has openings to allow the application of metal contacts.

26. A photo-detector comprising stacked detector sub-units as in claim 1 in which each detector sub-unit has a different cut-off wavelength.

27. An array of detectors in which each detector is as in claim 1 is connected to a silicon readout circuit by an indium bump.

28. A photo-detector, comprising:
a heterostructure comprising
a first heterojunction comprising an n-type contact layer and a n-type middle barrier layer, and a second heterojunction comprising the n-type middle barrier layer and a p-type photon absorbing layer having an energy bandgap, said second heterojunction having an p-type δ-doping layer formed at the edge of the photon absorbing layer such that a p-n junction is formed between said barrier layer and said p-type δ-doping layer,
the energy bandgap of the p-type photon absorbing layer being narrower than the energy bandgap of the n-type middle barrier layer,
the first and second heterojunctions being configured to prevent creation of a depletion region in the p-type photon absorbing layer when a bias voltage is applied across the heterostructure, wherein a tunnel current of holes from the contact layer to the photon absorbing layer is less than a dark current in the photo-detector, wherein the dark current from the photon-absorbing layer to the barrier layer is essentially diffusion limited, and wherein generation recombination (GR) noise is reduced.

29. A photo-detector according to claim 28, wherein the photon absorbing layer has a thickness of 1-10µ and doping of $p<10^{16}$ cm$^{-3}$.

30. A photo-detector according to claim 28, wherein the barrier layer is doped n-type, $n<5\times10^{16}$ cm$^{-3}$, and the n-type contact layer has a doping of $n<5\times10^{18}$ cm$^{-3}$.

31. A photo-detector according to claim 28, in which the p-type photon absorbing layer is terminated by a highly p-doped terminating layer, with $3\times10^{17}<p<3\times10^{20}$ acceptors cm$^{-3}$, and with thickness 0.5-4 µm, so that a conduction band edge of the highly p-doped terminating layer lies above that in the next p-type photon absorbing layer.

32. A photo-detector comprising stacked detector sub-units as in claim 31 in which each detector sub-unit has a different cut-off wavelength.

33. An array of detectors in which each detector is as in claim 31 is connected to a silicon readout circuit by an indium bump.

34. A photo-detector comprising stacked detector sub-units as in claim 28 in which each detector sub-unit has a different cut-off wavelength.

35. An array of detectors in which each detector is sensitive to more than one wavelength band as in claim 34, and in which each detector is connected to a silicon readout circuit using one indium bump or using one indium bump per detector sub-unit.

36. An array of detectors in which each detector is as in claim 28 is connected to a silicon readout circuit by an indium bump.

37. A photo-detector according to claim 28, wherein one or more mesa structures are etched through the uppermost layer to a depth suitable for electrical isolation.

38. A photo-detector according to claim 37, in which the surfaces of each mesa structure exposed by the etch treatment undergo a chemical treatment after which a dielectric layer is applied, and wherein said dielectric layer has openings to allow the application of metal contacts.

39. A photo-detector according to claim 37, to which a dielectric layer is applied to the surfaces of each mesa structure exposed by the etch treatment, and wherein said dielectric layer has openings to allow the application of metal contacts.

40. A photo-detector according to claim 28, wherein the p-type δ-doping layer has $5\times10^{10}<p<10^{12}$ acceptors cm$^{-2}$.

41. A photo-detector according to claim 28, wherein the layer materials are selected such that the middle barrier layer has an energy bandgap at least twice said energy bandgap of the photon absorbing layer, and wherein under flat band conditions a conduction band edge of the contact layer lies above its own valence band edge or above a valence band edge of the barrier layer, by at least twice the bandgap energy of the photon absorbing layer.

42. A photo-detector according to claim 28, wherein the layer materials are selected such that when biased with an externally applied voltage, the bands in the photon absorbing layer next to the barrier layer are flat or accumulated, such that a depletion region exists only in the barrier and contact layers but not in the photon absorbing layer, and a conduction band edge in any part of the photon absorbing layer lies above a conduction band edge in any part of the contact layer and does not lie more than 10 $kT_{op}$ below the conduction band edge in any part of the barrier layer, where k is the Boltzman constant and $T_{op}$ is the operating temperature.

* * * * *